US012796055B2

(12) United States Patent
Tsai et al.

(10) Patent No.: US 12,796,055 B2
(45) **Date of Patent: *Nov. 10, 2026**

(54) INTEGRATED CIRCUITS HAVING PROTRUDING INTERCONNECT CONDUCTORS

(71) Applicant: Taiwan Semiconductor Manufacturing Co., Ltd., Hsin-Chu (TW)

(72) Inventors: Chen-Hung Tsai, Hsinchu (TW); Chen-Ming Lee, Taoyuan County (TW); Fu-Kai Yang, Hsinchu City (TW); Mei-Yun Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 638 days.

This patent is subject to a terminal disclaimer.

(21) Appl. No.: 18/358,634

(22) Filed: Jul. 25, 2023

(65) Prior Publication Data

US 2023/0369427 A1 Nov. 16, 2023

Related U.S. Application Data

(60) Continuation of application No. 17/195,251, filed on Mar. 8, 2021, now Pat. No. 11,728,397, which is a
(Continued)

(51) Int. Cl.
*H10D 64/23* (2025.01)
*H10D 30/62* (2025.01)
(Continued)

(52) U.S. Cl.
CPC ....... *H10D 64/256* (2025.01); *H10D 30/6219* (2025.01); *H10D 64/01* (2025.01);
(Continued)

(58) Field of Classification Search
CPC .. H10D 64/256; H10D 30/6219; H10D 64/01; H10D 62/151; H10D 30/024;
(Continued)

(56) References Cited

U.S. PATENT DOCUMENTS 8,772,109 B2 7/2014 Colinge
8,785,285 B2 7/2014 Tsai et al.
(Continued)

*Primary Examiner* — Scott B Geyer
(74) *Attorney, Agent, or Firm* — HAYNES AND BOONE, LLP

(57) ABSTRACT

Examples of an integrated circuit with an interconnect structure and a method for forming the integrated circuit are provided herein. In some examples, the method includes receiving a workpiece that includes an inter-level dielectric layer. A first contact that includes a fill material is formed that extends through the inter-level dielectric layer. The inter-level dielectric layer is recessed such that the fill material extends above a top surface of the inter-level dielectric layer. An etch-stop layer is formed on the inter-level dielectric layer such that the fill material of the first contact extends into the etch-stop layer. A second contact is formed extending through the etch-stop layer to couple to the first contact. In some such examples, the second contact physically contacts a top surface and a side surface of the first contact.

20 Claims, 19 Drawing Sheets

Related U.S. Application Data division of application No. 16/280,433, filed on Feb. 20, 2019, now Pat. No. 10,943,983.

(60) Provisional application No. 62/751,935, filed on Oct. 29, 2018.

(51) Int. Cl.

| | |
|---|---|
| ***H10D 62/13*** | (2025.01) |
| ***H10D 64/01*** | (2025.01) |
| ***H10P 14/40*** | (2026.01) |
| ***H10W 20/00*** | (2026.01) |
| ***H10W 20/42*** | (2026.01) |

(52) U.S. Cl.

CPC ......... *H10P 14/412* (2026.01); *H10W 20/076* (2026.01); *H10D 62/151* (2025.01); *H10W 20/082* (2026.01); *H10W 20/083* (2026.01); *H10W 20/42* (2026.01)

(58) Field of Classification Search

CPC ............... H10D 30/62; H10D 64/0112; H10D 84/0149; H10D 84/0158; H10D 84/038; H10D 84/834; H10P 14/412; H10W 20/076; H10W 20/082; H10W 20/083; H10W 20/42; H10W 20/048; H10W 20/063; H10W 20/40; H10W 20/081; H10W 20/056

See application file for complete search history.

(56) References Cited

U.S. PATENT DOCUMENTS

| | | | | |
|---|---|---|---|---|
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 9,105,490 | B2 | 8/2015 | Wang et al. | |
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 9,780,025 | B2 | 10/2017 | Zhang et al. | |
| 10,170,376 | B1 | 1/2019 | Hung | |
| 10,204,826 | B1 | 2/2019 | Hsu et al. | |
| 10,374,040 | B1 * | 8/2019 | Chanemougame .. | H10D 62/151 |
| 11,728,397 | B2 * | 8/2023 | Tsai ..................... | H10D 64/256 257/774 |
| 2005/0130367 | A1 | 6/2005 | Lee et al. | |
| 2005/0224986 | A1 | 10/2005 | Tseng et al. | |
| 2007/0052096 | A1 | 3/2007 | Su et al. | |
| 2007/0278693 | A1 | 12/2007 | Lehr et al. | |
| 2010/0044869 | A1 | 2/2010 | Zhang et al. | |
| 2011/0298045 | A1 * | 12/2011 | Kalnitsky ............ | H10D 30/668 257/E21.409 |
| 2012/0313247 | A1 | 12/2012 | Yu et al. | |
| 2014/0151763 | A1 | 6/2014 | Hung et al. | |
| 2014/0264523 | A1 * | 9/2014 | Loechelt ................ | H10B 12/37 438/386 |
| 2014/0264641 | A1 | 9/2014 | Frohberg et al. | |
| 2015/0137377 | A1 | 5/2015 | Bao et al. | |
| 2016/0049427 | A1 | 2/2016 | Zang | |
| 2016/0141207 | A1 | 5/2016 | Hung et al. | |
| 2016/0190062 | A1 | 6/2016 | Zheng et al. | |
| 2016/0315045 | A1 | 10/2016 | Baek et al. | |
| 2016/0336412 | A1 | 11/2016 | Hung et al. | |
| 2017/0047245 | A1 | 2/2017 | Chen | |
| 2017/0179240 | A1 | 6/2017 | Radens et al. | |
| 2017/0222008 | A1 | 8/2017 | Hsu et al. | |
| 2018/0166571 | A1 * | 6/2018 | Liu ...................... | H10D 30/797 |
| 2018/0190809 | A1 | 7/2018 | Huang et al. | |
| 2018/0198059 | A1 | 7/2018 | Ko et al. | |
| 2018/0301371 | A1 | 10/2018 | Wang et al. | |
| 2018/0323107 | A1 | 11/2018 | Zhou | |
| 2019/0058109 | A1 | 2/2019 | Chen et al. | |
| 2019/0157141 | A1 | 5/2019 | Liao et al. | |
| 2019/0157405 | A1 | 5/2019 | Huang et al. | |
| 2019/0157406 | A1 | 5/2019 | Hwang et al. | |
| 2019/0165099 | A1 | 5/2019 | Chen et al. | |
| 2019/0165174 | A1 * | 5/2019 | Peng .................... | H10D 30/797 |
| 2019/0189508 | A1 | 6/2019 | Peethala et al. | |
| 2019/0259855 | A1 | 8/2019 | Cheng et al. | |
| 2019/0287851 | A1 | 9/2019 | Chen et al. | |
| 2019/0305098 | A1 * | 10/2019 | Ahn ................... | H10D 30/6219 |
| 2019/0341300 | A1 | 11/2019 | Glass et al. | |
| 2019/0355665 | A1 | 11/2019 | Mannebach et al. | |
| 2020/0135871 | A1 | 4/2020 | Tsai et al. | |

* cited by examiner

INTEGRATED CIRCUITS HAVING PROTRUDING INTERCONNECT CONDUCTORS

PRIORITY DATA

The present application is a continuation application of U.S. patent application Ser. No. 17/195,251, filed on Mar. 8, 2021, which is a divisional application of U.S. patent application Ser. No. 16/280,433, filed on Feb. 20, 2019 and issued as U.S. Pat. No. 10,943,983 on Mar. 9, 2021, which claims the benefit of U.S. Provisional Application No. 62/751,935, entitled “Integrated Circuits Having Protruding Interconnect Conductors,” filed Oct. 29, 2018, each of which herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

Advances have been made to device fabrication as well as to the fabrication of the network of conductors that couple them. In that regard, an integrated circuit may include an interconnect structure to electrically couple the circuit devices (e.g., Fin-like Field Effect Transistors (FinFETs), planar FETs, memory devices, Bipolar-Junction Transistors (BJTs), Light-Emitting Diodes (LEDs), other active and/or passive devices, etc.). The interconnect structure may include any number of dielectric layers stacked vertically with conductive lines running horizontally within the layers. Vias may extend vertically to connect conductive lines in one layer with conductive lines in an adjacent layer. Similarly, contacts may extend vertically between the conductive lines and substrate-level features. Together, the lines, vias, and contacts carry signals, power, and ground between the devices and allow them to operate as a circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
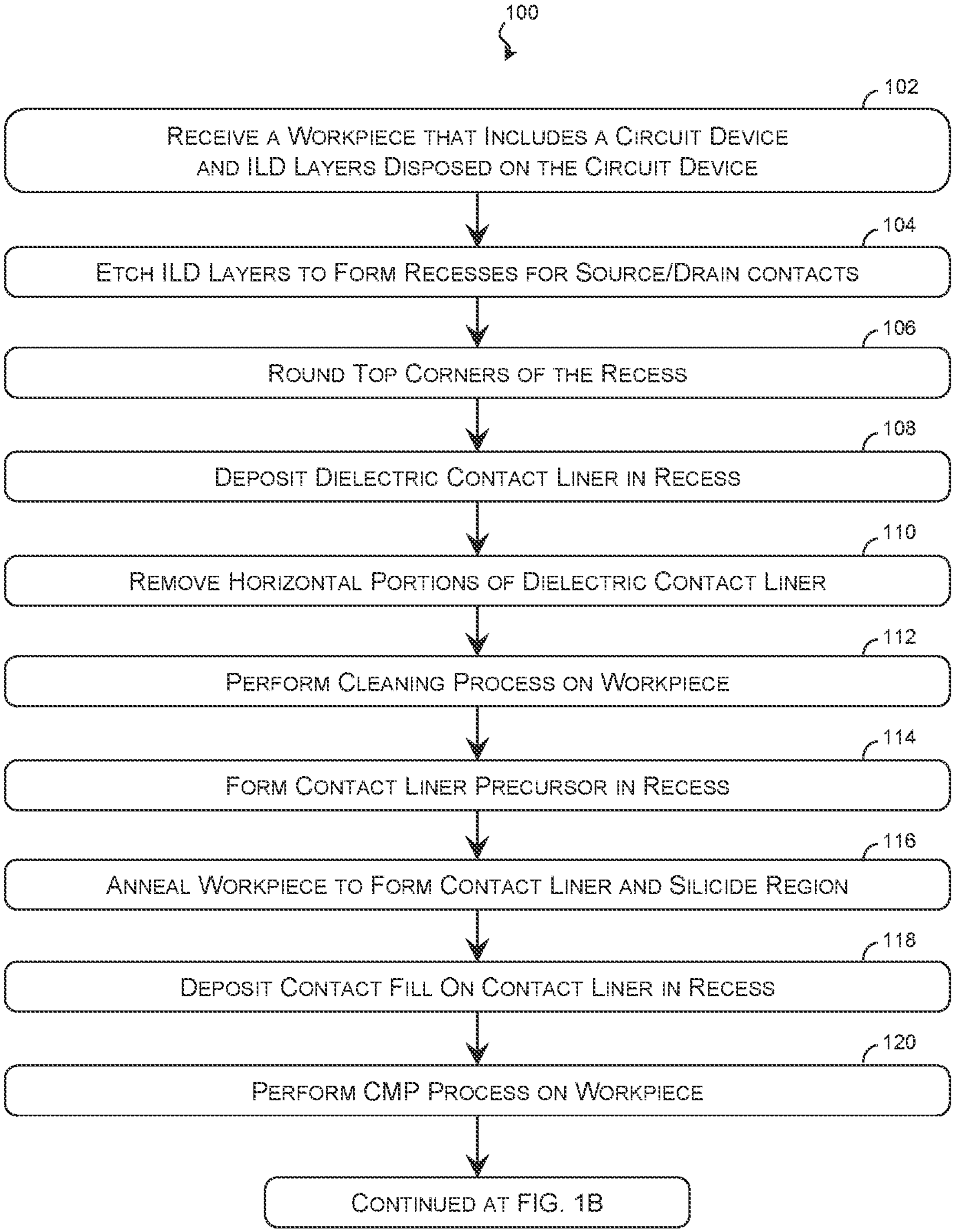
FIGS. 1A and 1B are flow diagrams of a method of fabricating a workpiece with an interconnect structure according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, “lower,” “upper,” “horizontal,” “vertical,” “above,” “over,” “below,” “beneath,” “up,” “down,” “top,” “bottom,” etc. as well as derivatives thereof (e.g., “horizontally,” “downwardly,” “upwardly,” etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

Integrated circuits include an ever-increasing number of active and passive circuit devices formed on a substrate or wafer with a complex interconnect structure disposed on top to electrically couple the devices. While there have been significant advances in fabrication and in miniaturizing the devices, the interconnect has generally resisted efforts to shrink it. As merely one issue, some interconnect features couple to other features on other layers, and smaller features may provide smaller landing areas for coupling to features on other layers. Accordingly, smaller features may have smaller tolerances for overlay errors between layers. Furthermore, because resistance depends on the cross-sectional area of a conductor, not only do smaller features have greater resistance, but the smaller contact areas may also increase interlayer resistance.

Some examples of the present technique address these issues and others by forming conductive interconnect features that extend through and above a dielectric interconnect material. This may provide a larger contact area because an upper level conductive feature may extend past the top surface of lower-level conductive feature to couple to the side surface as well as the top surface. The larger contact area may reduce the interlayer resistance and may also provide a reliable electrical connection despite overlay errors. A liner may also be pulled back from the side surface of the lower-level conductive feature to further reduce the resistance at this interface. In some examples, the improved interface allows for even smaller conductive features to be formed reliably. It is noted that these advantages are merely examples, and no particular advantage is required for any particular embodiment.

Figure 1B:
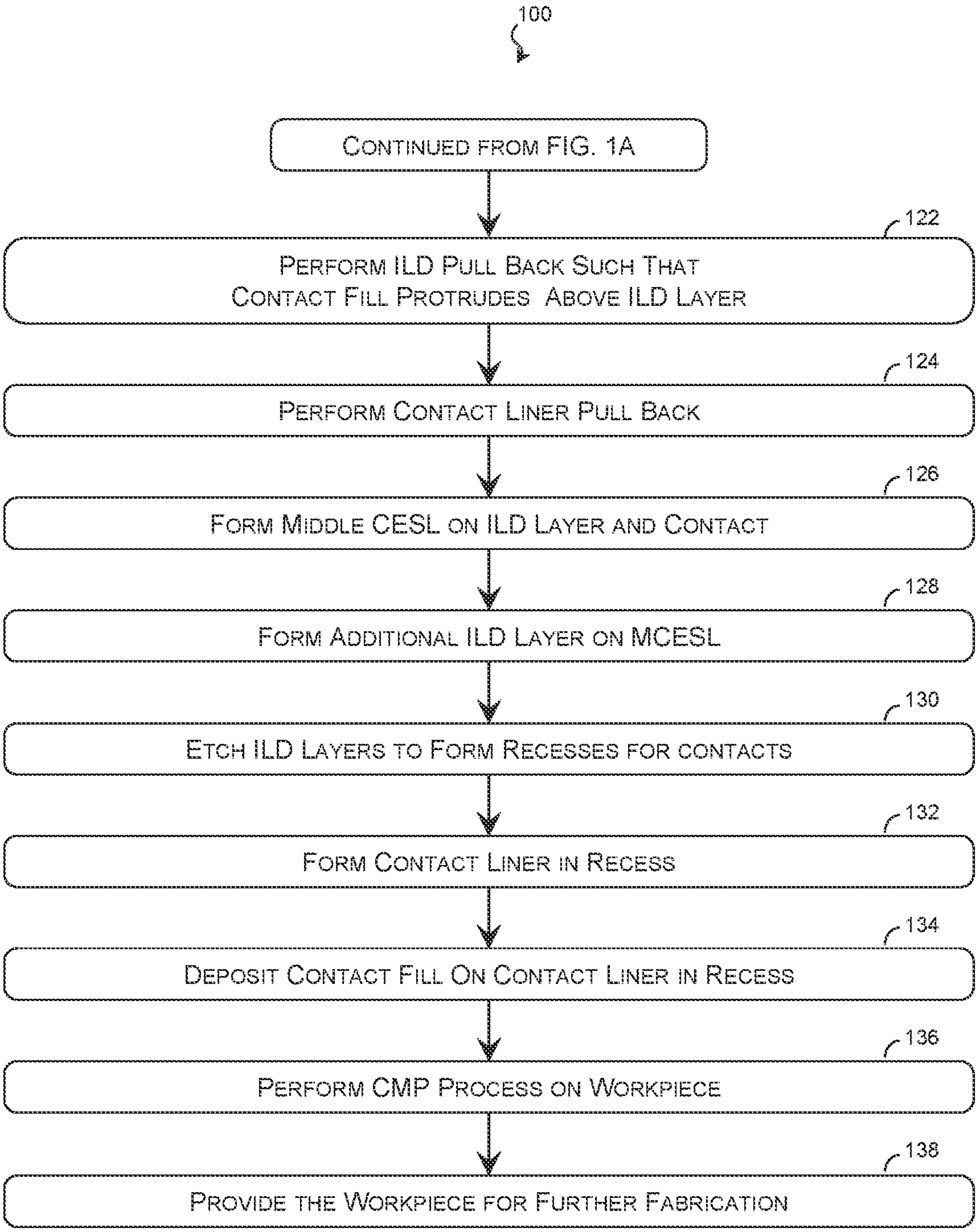
Figure 2:
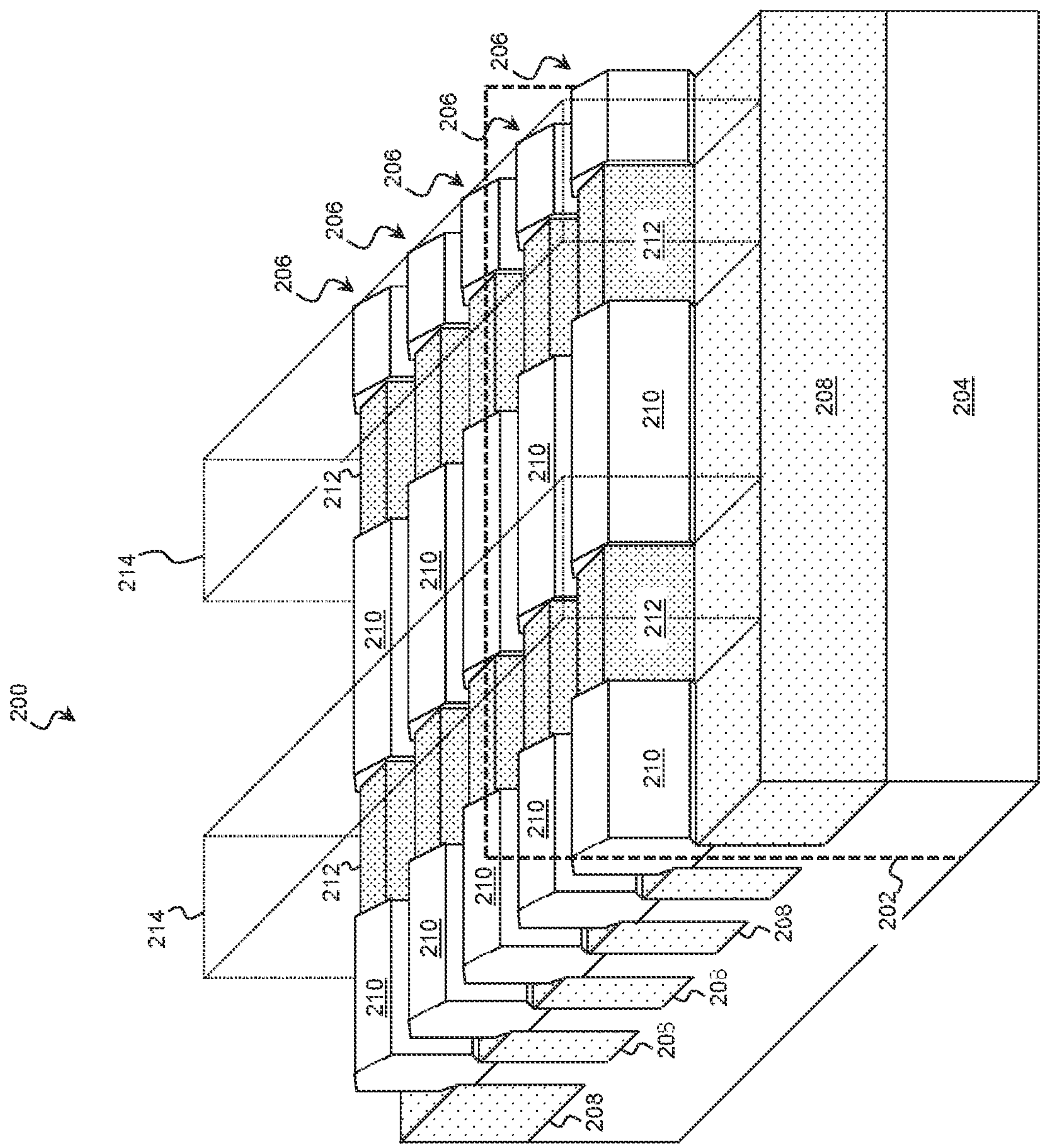
FIG. 2 is a perspective illustration of the workpiece undergoing a method of fabrication according to various aspects of the present disclosure.

The present disclosure provides examples of an integrated circuit that includes an interconnect structure. Examples of the circuit and a technique for forming the circuit are described with reference to FIGS. 1A-17. In that regard, FIGS. 1A and 1B are flow diagrams of a method 100 of fabricating a workpiece 200 with an interconnect structure according to various aspects of the present disclosure. Additional steps can be provided before, during, and after the method 100, and some of the steps described can be replaced or eliminated for other embodiments of the method 100. FIG. 2 is a perspective illustration of the workpiece 200 undergoing the method 100 of fabrication according to various aspects of the present disclosure. FIGS. 3-17 are cross-sectional illustrations of the workpiece 200 taken in a fin-length direction that cut through a fin, as indicated by plane 202, according to various aspects of the present disclosure.

Referring to block 102 of FIG. 1A and to FIG. 2, a workpiece 200 is received that includes one or more circuit devices such as planar Field Effect Transistors (FETs), Fin-like FETs (FinFETs), memory devices, bipolar-junction transistors, light-emitting diodes LEDs, other active and/or passive devices, etc. In the example of FIG. 2, the workpiece 200 includes FinFETs, although the technique is equally suitable for planar FETs, vertical FETs, and/or any other suitable type and configuration of circuit device.

The workpiece 200 includes a substrate 204 upon which the circuit device(s) are formed. In various examples, the substrate 204 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 204 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 204. In some such examples, a layer of the substrate 204 may include an insulator such as a semiconductor oxide, a semiconductor nitride, a semiconductor oxynitride, a semiconductor carbide, and/or other suitable insulator materials.

Doped regions, such as wells, may be formed on the substrate 204. In that regard, some portions of the substrate 204 may be doped with p-type dopants, such as boron, $BF_2$, or indium while other portions of the substrate 204 may be doped with n-type dopants, such as phosphorus or arsenic; and/or other suitable dopants including combinations thereof.

In some examples, the devices on the substrate 204 extend out of the substrate 204. For example, FinFETs and/or other non-planar devices may be formed on device fins 206 disposed on the substrate 204. The device fins 206 are representative of any raised feature and include FinFET device fins 206 as well as fins 206 for forming other raised active and passive devices upon the substrate 204. The fins 206 may be similar in composition to the substrate 204 or may be different therefrom. For example, in some embodiments, the substrate 204 may include primarily silicon, while the fins 206 include one or more layers that are primarily germanium or a SiGe semiconductor. In some embodiments, the substrate 204 includes a SiGe semiconductor, and the fins 206 include a SiGe semiconductor with a different ratio of silicon to germanium than the substrate 204.

The fins 206 may be formed by etching portions of the substrate 204, by depositing various layers on the substrate 204 and etching the layers, and/or by other suitable techniques. For example, the fins 206 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins 206 may be physically and electrically separated from each other by isolation features 208, such as a shallow trench isolation features (STIs). In various examples, the isolation features 208 include dielectric materials such as semiconductor oxides, semiconductor nitrides, semiconductor carbides, FluoroSilicate Glass (F SG), low-k dielectric materials, and/or other suitable dielectric materials.

Each device fin 206 may include any number of circuit devices, such as FinFETs, that, in turn, each include a pair of opposing source/drain features 210 separated by a channel region 212. The source/drain features 210 may include a semiconductor (e.g., Si, Ge, SiGe, etc.) and one or more dopants, such as p-type dopants (e.g., boron, $BF_2$, or indium) or n-type dopants (e.g., phosphorus or arsenic). Similarly, the channel region 212 may include a semiconductor and one or more dopants of the opposite type of those of the source/drain features 210.

The flow of carriers (electrons for an n-channel FinFET and holes for a p-channel FinFET) through the channel region 212 is controlled by a voltage applied to a gate structure 214 adjacent to and overwrapping the channel region 212. To avoid obscuring other elements, the gate structures 214 are translucent in FIG. 2.

Figure 3:
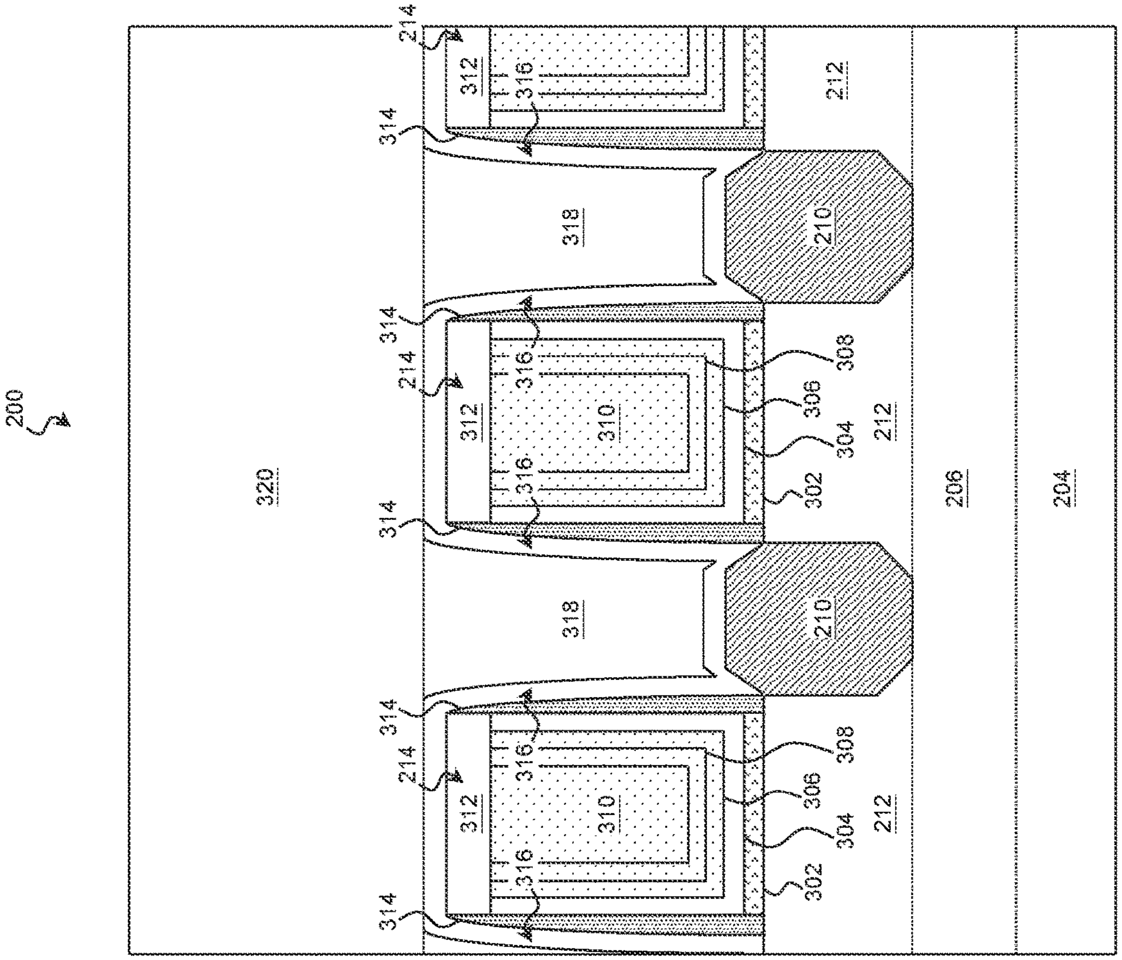
FIGS. 3-17 are cross-sectional illustrations of the workpiece taken in a fin-length direction that cut through a fin according to various aspects of the present disclosure.
Figure 4:
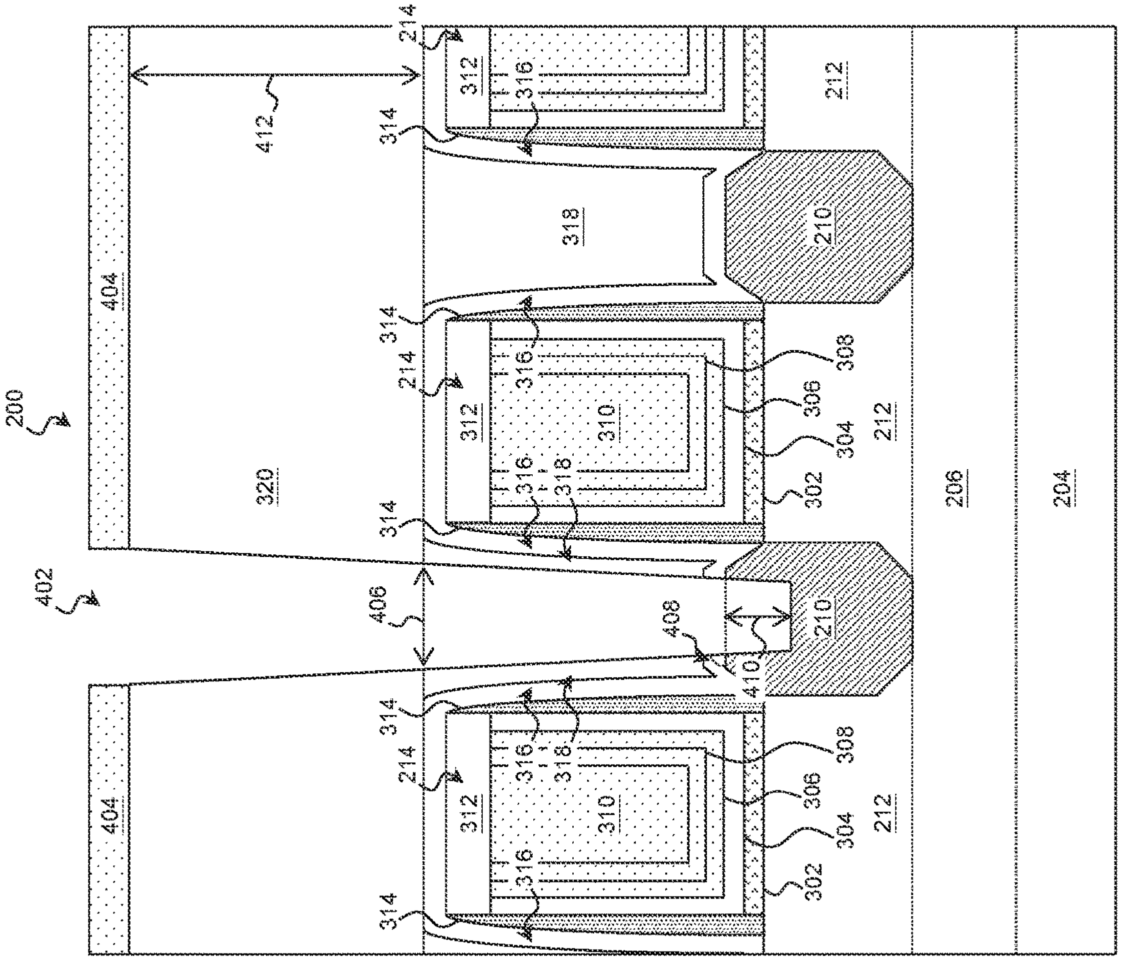

Referring to FIG. 3, a portion of the received workpiece 200 is shown in more detail. For example, the gate structure 214 is shown and includes, in some examples, an interfacial layer 302 disposed on the top and side surfaces of the channel regions 212. The interfacial layer 302 may include an interfacial material, such as a semiconductor oxide, semiconductor nitride, semiconductor oxynitride, other semiconductor dielectrics, other suitable interfacial materials, and/or combinations thereof The gate structure 214 may also include a gate dielectric 304 disposed on the interfacial layer 302. The gate dielectric 304 may also extend vertically along the sides of the gate structure 214. The gate dielectric 304 may include one or more dielectric materials, which are commonly characterized by their dielectric constant relative to silicon dioxide. In some embodiments, the gate dielectric 304 includes a high-k dielectric material, such as $HfO_2$, HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 304 may include other dielectrics, such as a semiconductor oxide, semiconductor nitride, semiconductor oxynitride, semiconductor carbide, amorphous carbon, TEOS, other suitable dielectric material, and/or combinations thereof. The gate dielectric 304 may be formed to any suitable thickness, and in some examples, the gate dielectric 304 has a thickness of between about 0.1 nm and about 3 nm.

A gate electrode is disposed on the gate dielectric 304. The gate electrode may include a number of different conductive layers, of which three exemplary types (a capping layer 306, work function layer(s) 308, and an electrode fill 310) are shown. With respect to the capping layer 306, it may include any suitable conductive material including metals (e.g., W, Al, Ta, Ti, Ni, Cu, Co, etc.), metal nitrides, and/or metal silicon nitrides. In various embodiments, the capping layer 306 includes TaSiN, TaN, and/or TiN.

The gate electrode may include one or more work function layers 308 on the capping layer 306. Suitable work function layer 308 materials include n-type and/or p-type work function materials based on the type of device. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof.

The gate electrode may also include an electrode fill 310 on the work function layer(s) 308. The electrode fill 310 may include any suitable material including metals (e.g., W, Al, Ta, Ti, Ni, Cu, Co, etc.), metal oxides, metal nitrides, and/or combinations thereof, and in an example, the electrode fill 310 includes tungsten.

In some examples, the gate structure 214 includes a gate cap 312 on top of the gate dielectric 304, the capping layer 306, the work function layer(s) 308, and/or the electrode fill 310. The gate cap 312 may include any suitable material, such as a dielectric material (e.g., a semiconductor oxide, a semiconductor nitride, a semiconductor oxynitride, a semiconductor carbide, a semiconductor oxycarbonitride, etc.), polysilicon, Spin On Glass (SOG), tetraethylorthosilicate (TEOS), Plasma Enhanced CVD oxide (PE-oxide), High-Aspect-Ratio-Process (HARP)-formed oxide, and/or other suitable material. In some examples, the gate cap 312 includes silicon oxycarbonitride. In some examples, the gate cap 312 has a thickness between about 1 nm and about 10 nm.

Sidewall spacers 314 are disposed on the side surfaces of the gate structures 214. The sidewall spacers 314 may be used to offset the source/drain features 210 and to control the source/drain junction profile. In various examples, the sidewall spacers 314 include one or more layers of suitable materials, such as a dielectric material (e.g., a semiconductor oxide, a semiconductor nitride, a semiconductor oxynitride, a semiconductor carbide, a semiconductor oxycarbonitride, etc.), SOG, TEOS, PE-oxide, HARP-formed oxide, and/or other suitable materials. In one such embodiment, the sidewall spacers 314 each include a first layer of silicon oxide, a second layer of silicon nitride disposed on the first layer, and a third layer of silicon oxide disposed on the second layer. In the embodiment, each layer of the sidewall spacers 314 has a thickness between about 1 nm and about 10 nm.

The workpiece 200 may also include a Bottom Contact Etch-Stop Layer (BCESL) 316 disposed on the source/drain features 210, on the gate structures 214, and alongside the sidewall spacers 314. The BCESL 316 may include a dielectric (e.g., a semiconductor oxide, a semiconductor nitride, a semiconductor oxynitride, a semiconductor carbide, etc.) and/or other suitable material. As the BCESL 316 provides protection from over etching during the etching of inter-level dielectric layers (described below), the composition of the BCESL 316 may be configured to have a different etch selectivity than the inter-level dielectric layers. In various embodiments, the BCESL 316 includes SiN, SiO, SiON, and/or SiC. The BCESL 316 may be formed to any suitable thickness, and in some examples, the BCESL 316 has a thickness between about 1 nm and about 20 nm.

One or more Inter-Level Dielectric (ILD) layers (e.g., layers 318 and 320) are disposed on the source/drain features 210 and gate structures 214 of the workpiece 200. The ILD layers 318 and 320 act as insulators that support and isolate conductive traces of an electrical multi-level interconnect structure. In turn, the multi-level interconnect structure electrically interconnects elements of the workpiece 200, such as the source/drain features 210 and the gate structures 214. The ILD layers 318 and 320 may include a dielectric material (e.g., a semiconductor oxide, a semiconductor nitride, a semiconductor oxynitride, a semiconductor carbide, etc.), SOG, FSG, PhosphoSilicate Glass (PSG), BoroPhosphoSilicate Glass (BPSG), Black Diamond®, Xerogel, Aerogel, amorphous fluorinated carbon, parylene, BCB, SiLK®, and/or combinations thereof Referring to block 104 of FIG. 1A and to FIG. 4, the ILD layers 318 and 320 are etched to form recesses 402 for source/drain contacts. The recesses 402 expose the source/drain features 210 and 212 at locations where conductive features of the interconnect are to be formed. In some such examples, this includes forming a photoresist 404 on the workpiece 200 and patterning the photoresist 404 in a photolithographic process to selectively expose portions of the ILD layers 318 and 320 to etch.

In one embodiment, a photolithographic system exposes the photoresist 404 to radiation in a particular pattern determined by a mask. Light passing through or reflecting off the mask strikes the photoresist 404 thereby transferring a pattern formed on the mask to the photoresist 404. In other such embodiments, the photoresist 404 is exposed using a direct write or maskless lithographic technique, such as laser patterning, e-beam patterning, and/or ion-beam patterning. Once exposed, the photoresist 404 is developed, leaving the exposed portions of the resist, or in alternative examples, leaving the unexposed portions of the resist. An exemplary patterning process includes soft baking of the photoresist 404, mask aligning, exposure, post-exposure baking, developing the photoresist 404, rinsing, and drying (e.g., hard baking).

The portions of the ILD layers 318 and 320 exposed by the photoresist 404 are then etched using any suitable etching technique such as wet etching, dry etching, RIE, and/or other etching methods. In some embodiments, the etching process includes dry etching using an oxygen-based etchant, a fluorine-based etchant (e.g., $CF_4$, $SF_6$, $CH_2F_2$, $CHF_3$, and/or $C_2F_6$), a chlorine-based etchant (e.g., $Cl_2$, $CHCl_3$, $CCl_4$, and/or $BCl_3$), a bromine-based etchant (e.g., HBr and/or $CHBR_3$), an iodine-based etchant, other suitable etchant gases or plasmas, and/or combinations thereof. The etching of the ILD layers 318 and 320 may be configured to further remove the exposed portions of the BCESL 316 or additional etching processes may be performed to open the BCESL 316.

The recesses 402 may have any suitable width, and in various embodiments, the width 406 of the recess 402 at a reference point, such as where the lower ILD layer 318 meets the upper ILD layer 320, is between about 15 nm and about 20 nm. The etching technique may be configured to produce recesses 402 with substantially vertical sidewalls. Conversely, in some embodiments, the etching technique may be configured to produce sidewalls that taper outward in a direction away from the substrate 204 (i.e., angle 408 being less than 90°). The tapered recesses 402 may reduce the occurrence of pinch-off, where deposition near the opening of a recess 402 seals the recess 402 before it is fully filled, and other adverse effects that may cause voids during the subsequent deposition processes that form the contacts. In some such embodiments, angle 408 is greater than or equal to 85° and less than 90°.

The etching technique may be configured to etch the material(s) of the ILD layers 318 and 320 and the BCESL 316 without significant etching of the surrounding materials. Additionally or in the alternative, in some examples, the etching technique is configured to etch a portion of the source/drain features 210 so that a contact formed in the recess will extend into the respective source/drain feature 210. The recesses 402 may extend any depth into the source/drain features 210, and in some examples, the recesses 402 extend between 1 nm and about 5 nm below the top surface of the source/drain features as indicated by marker 410.

Any remaining photoresist 404 may be removed after etching the recesses 402. For reference, the thickness 412 of the ILD layer 320 above the top of the BCESL 316 may be between about 50 nm and about 100 nm at the conclusion of block 104.

Figure 5:
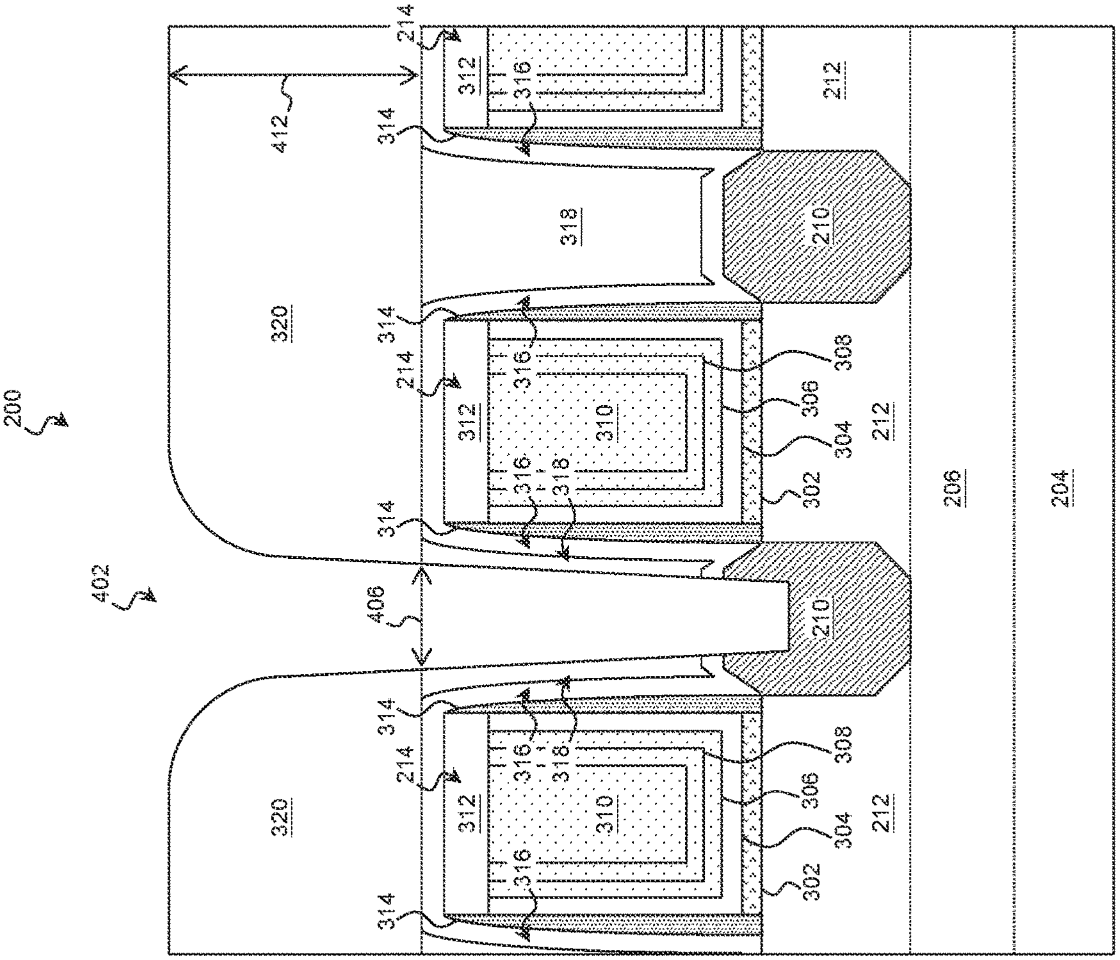

Referring to block 106 of FIG. 1A and to FIG. 5, an additional etching process is performed on the topmost portion of the upper ILD layer 320 to round the corners of the recesses 402 and thereby widen the uppermost portions of the recesses 402. This may further reduce the likelihood of pinch-off and rectify other causes of fill irregularities. The topmost portions of the upper ILD layer 320 may be etched using any suitable etching technique, such as wet etching, dry etching, RIE, and/or other etching methods, and the etching technique may be configured to avoid significant etching of the surrounding materials, such as the lower ILD layer 318, the source/drain features 210, and/or the BCESL 316. The etching may reduce the thickness 412 of the upper ILD layer 320 above the top of the BCESL 316 by between about 5 nm and about 20 nm (e.g., between about 10% and about 20%), and the thickness 412 of the ILD layer 320 may be between about 40 nm and about 90 nm at the conclusion of block 106. In some such examples, the width 406 of the recess 402 at the interface between the ILD layers 318 and 320 remains between about 15 nm and about 20 nm.

Figure 6:
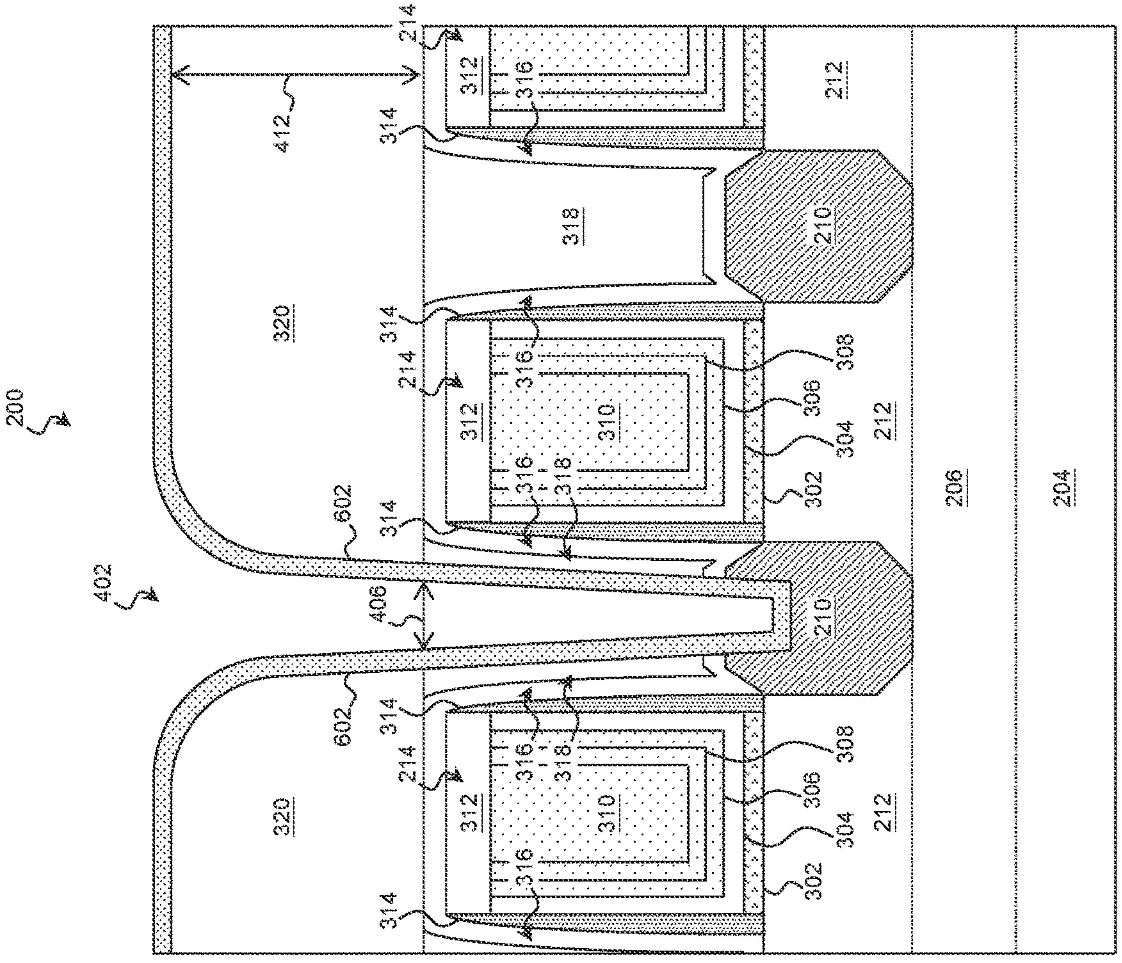

Referring to block 108 of FIG. 1A and to FIG. 6, a dielectric contact liner 602 is deposited on the side surfaces of the recess 402. The dielectric contact liner 602 may include a dielectric material (e.g., a semiconductor oxide, a semiconductor nitride, a semiconductor oxynitride, a semiconductor carbide, a semiconductor oxycarbonitride, etc.) and/or other suitable material. In some examples, the dielectric contact liner 602 includes a semiconductor nitride (e.g., SiN).

The dielectric contact liner 602 may be deposited using Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. The dielectric contact liner 602 may be formed to any suitable thickness, and in various such examples, the dielectric contact liner 602 is formed by an ALD process to have a thickness between about 1 nm and about 5 nm.

Figure 7:
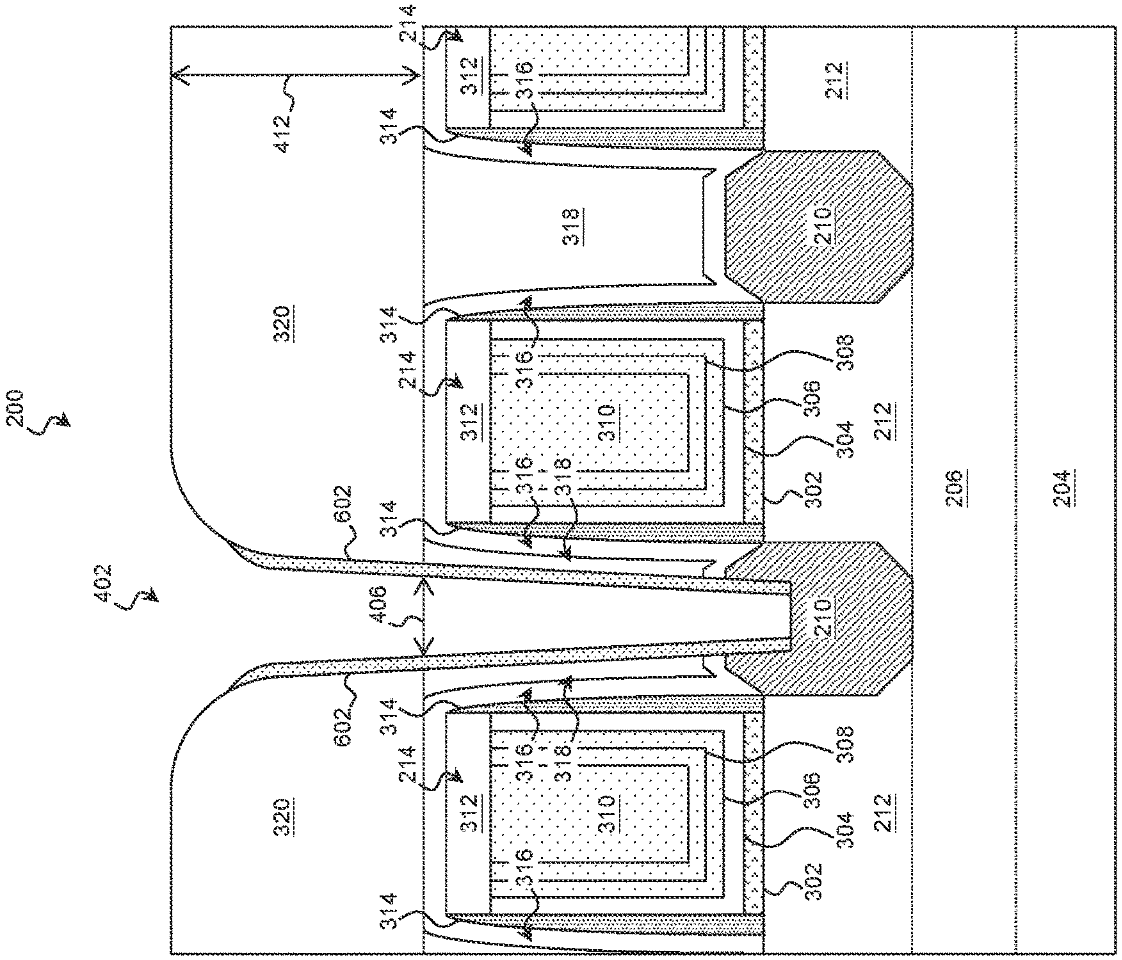

Referring to block 110 of FIG. 1A and to FIG. 7, the horizontal portions of the dielectric contact liner 602 are removed using a directional etching technique. The etching may be configured so that the vertical portions of the dielectric contact liner 602 remain on the side surfaces of the ILD layers 318 and 320, the BCESL 316, and/or the source/drain features 210. The horizontal portions of the dielectric contact liner may be etched using any suitable etching technique including anisotropic dry etching, wet etching, RIE, and/or other anisotropic etching techniques. In some embodiments, the etching process includes high-density plasma dry etching using a combination of $CH_3F$, COS (carbonyl sulfide), and $H_2$.

The particular etching technique may be configured to avoid significant etching of the ILD layers 318 and 320 and the source/drain feature 210. However, in some examples, the thickness 412 of the ILD layer 320 above the BCESL 316 is reduced by between about 1 nm and about 5 nm. Accordingly, the thickness 412 of the ILD layer 320 may be between about 40 nm and about 90 nm at the conclusion of block 110. In some such examples, the width 406 of the recess 402 at the interface of the ILD layers 318 and 320 may be between about 10 nm and about 15 nm at the end of block 110.

Referring to block 112 of FIG. 1A, the workpiece 200 is cleaned prior to forming a conductive contact liner to remove native oxides and other contaminants. The cleaning process may use any suitable wet cleaning or dry cleaning process, and in some examples, this includes a wet clean where de-ionized water (DI), SC1 (DI, $NH_4OH$, and/or $H_2O_2$), SC2 (DI, HCl, and/or $H_2O_2$), ozonated de-ionized water ($DIWO_3$), SPM ($H_2SO_4$ and/or $H_2O_2$), SOM ($H_2SO_4$ and/or $O_3$), SPOM, $H_3PO_4$, dilute hydrofluoric acid (DHF), HF, HF/ethylene glycol (EG), $HF/HNO_3$, $NH_4OH$, tetramethylammonium hydroxide (TMAH), etc. are applied to the workpiece 200 including within the recesses 402. The workpiece 200 and/or wet cleaning solution may be agitated using ultrasonic energy or any other technique to facilitate the cleaning process. Likewise, heat may be applied to promote the cleaning.

The cleaning may reduce the thickness 412 of the ILD layer 320 above the top of the BCESL 316 by between about 5 nm and about 20 nm (e.g., between about 10% and about 20%), and the thickness 412 of the ILD layer 320 may be between about 30 nm and about 80 nm at the conclusion of block 112.

Figure 8:
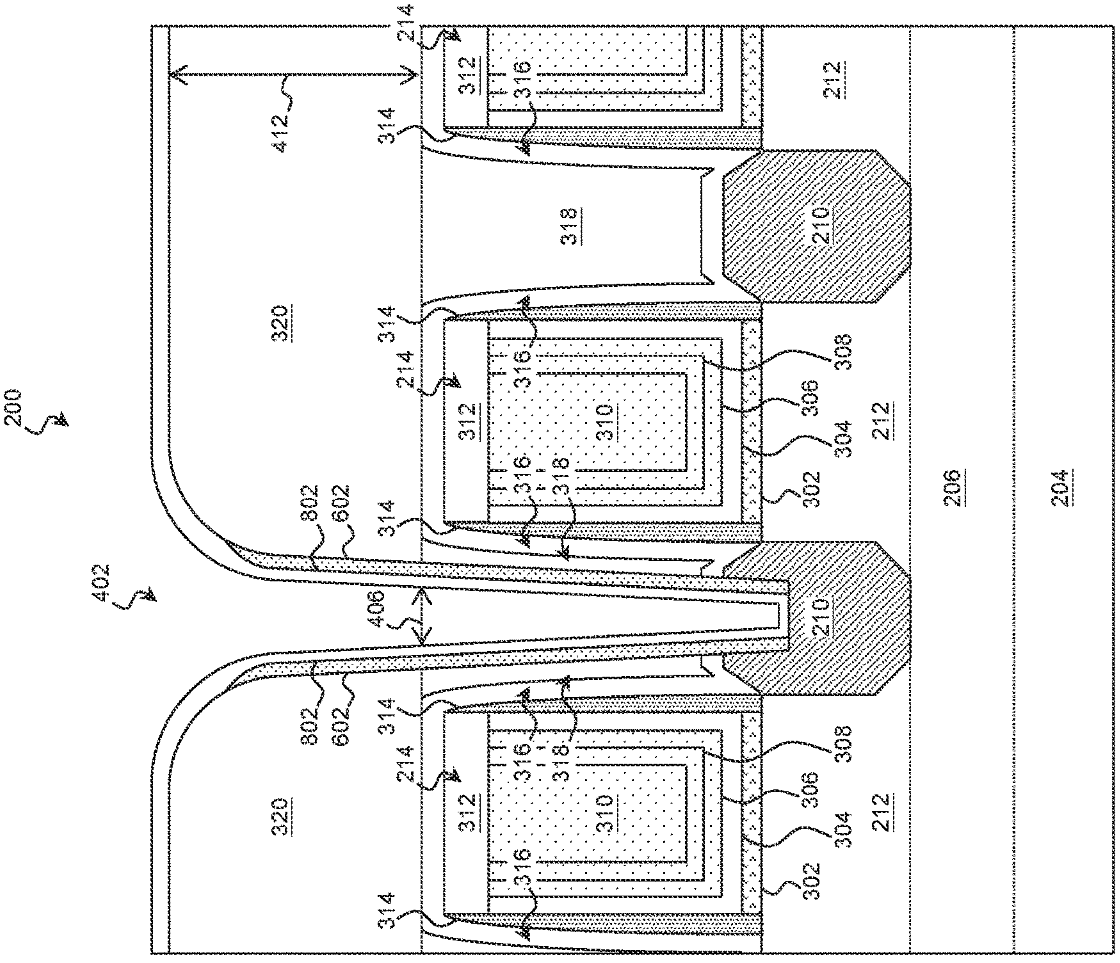

Referring to block 114 of FIG. 1A and to FIG. 8, a contact liner precursor 802 is formed on the side and bottom surfaces of the recesses 402. The contact liner precursor 802 may form a liner that promotes adhesion between a contact fill material and a remainder of the workpiece 200. The contact liner precursor 802 may also act a barrier that prevents material of the contact from diffusing into the workpiece 200. In some examples, the contact liner precursor 802 also forms a silicide at an interface with the source/drain features 210. Accordingly, the contact liner precursor 802 may include any suitable conductive material including metals (e.g., Ti, Ta, Co, W, Al, Ni, Cu, Co, etc.), metal nitrides, metal silicon nitrides, and/or other suitable materials. In one such embodiment, the contact liner precursor 802 includes Ti.

The contact liner precursor 802 may be deposited using ALD, PEALD, CVD, PECVD, HDP-CVD, and/or other suitable deposition processes. The contact liner precursor 802 may be formed to any suitable thickness and, in various examples, is formed by a CVD process to have a thickness between about 1 nm and about 5 nm.

Figure 9:
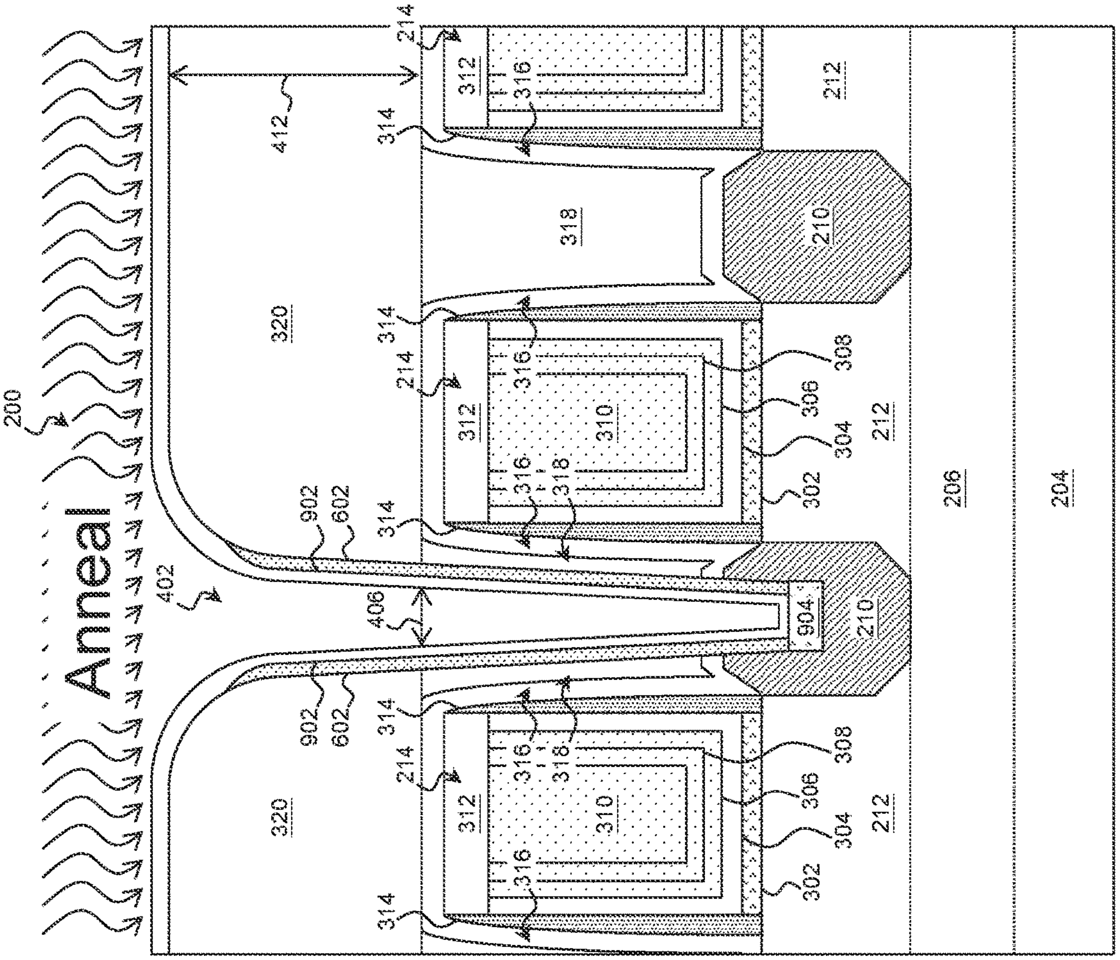

Referring to block 116 of FIG. 1A and to FIG. 9, the workpiece 200 is annealed to convert the contact liner precursor 802 into a contact liner 902. To do so, the annealing process may introduce nitrogen into the contact liner precursor 802 from ambient $N_2$ and/or $NH_3$ present during the annealing. In an example, the annealing converts a contact liner precursor 802 that is predominantly Ti into a contact liner 902 that includes TiN.

The annealing process may also cause a metal or other conductive material to diffuse from the contact liner precursor 802 into a source/drain feature 210 to form a silicide feature 904 between the remaining source/drain feature 210 and the contact liner 902. The silicide feature 904 may reduce the resistance at the interface between the source/drain feature 210 and the contact liner 902. In one such example, the annealing causes titanium to diffuse from the contact liner precursor 802 to form a silicide feature 904 that includes $TiSi_X$. The silicide feature 904 may have any suitable thickness, and in some examples is between about 1 nm and about 5 nm thick.

In various examples, the annealing process heats the workpiece 200 to between about 350° C. and about 500° C. for between about 30 seconds and about 5 minutes in an environment containing $N_2$ and/or $NH_3$ to form the contact liner 902 and the silicide feature 904.

Figure 10:
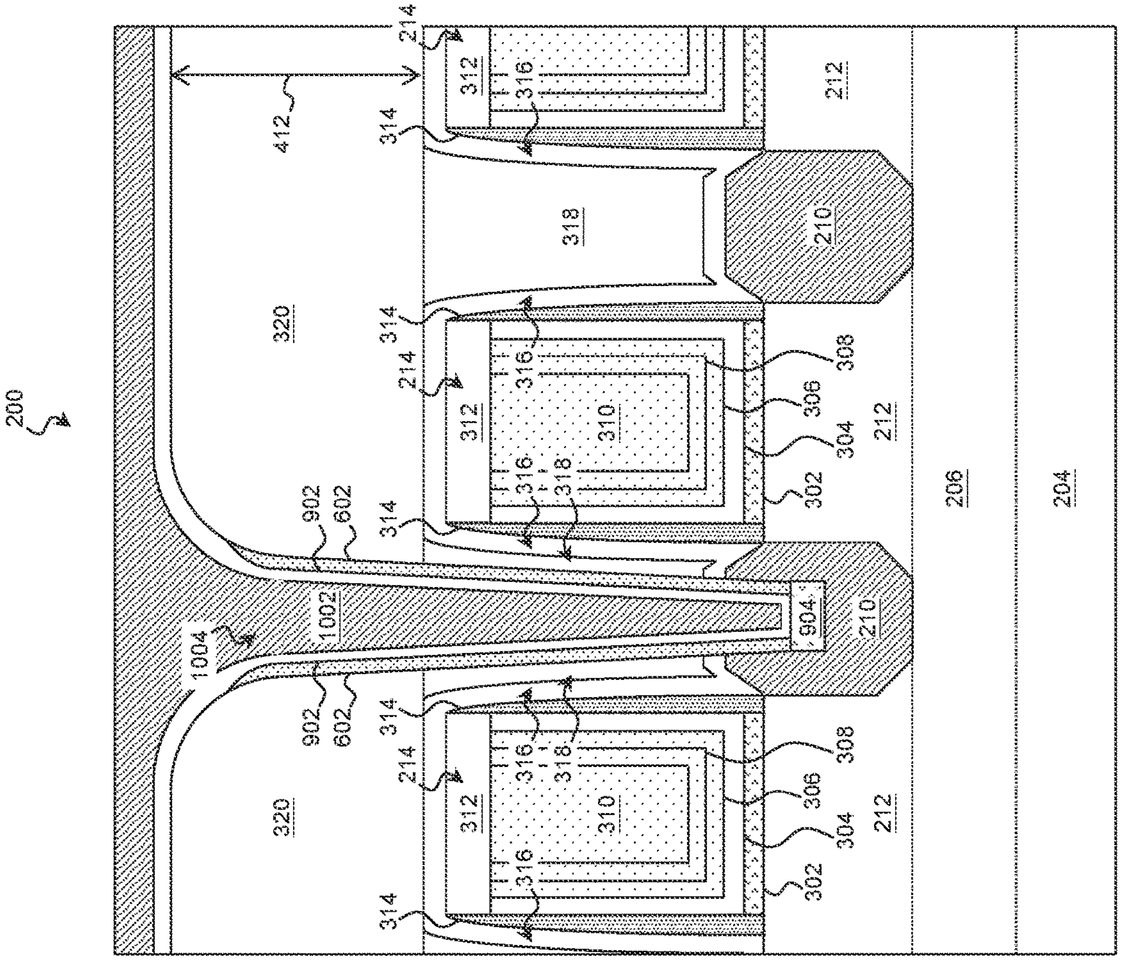

Referring to block 118 of FIG. 1A and to FIG. 10, a contact fill 1002 is deposited on the workpiece 200 including on the contact liner 902 within the recesses 402 to define source/drain contacts 1004 that include the contact liner 902 and the contact fill 1002. The contact fill 1002 may be deposited by any suitable technique including ALD, PEALD, CVD, PE CVD, Physical Vapor Deposition (PVD), and/or combinations thereof. The contact fill 1002 may include any suitable material including metals (e.g., Co, W, Al, Ta, Ti, Ni, Cu, etc.), metal oxides, metal nitrides and/or combinations thereof, and in an example, the contact fill 1002 includes cobalt.

Figure 11:
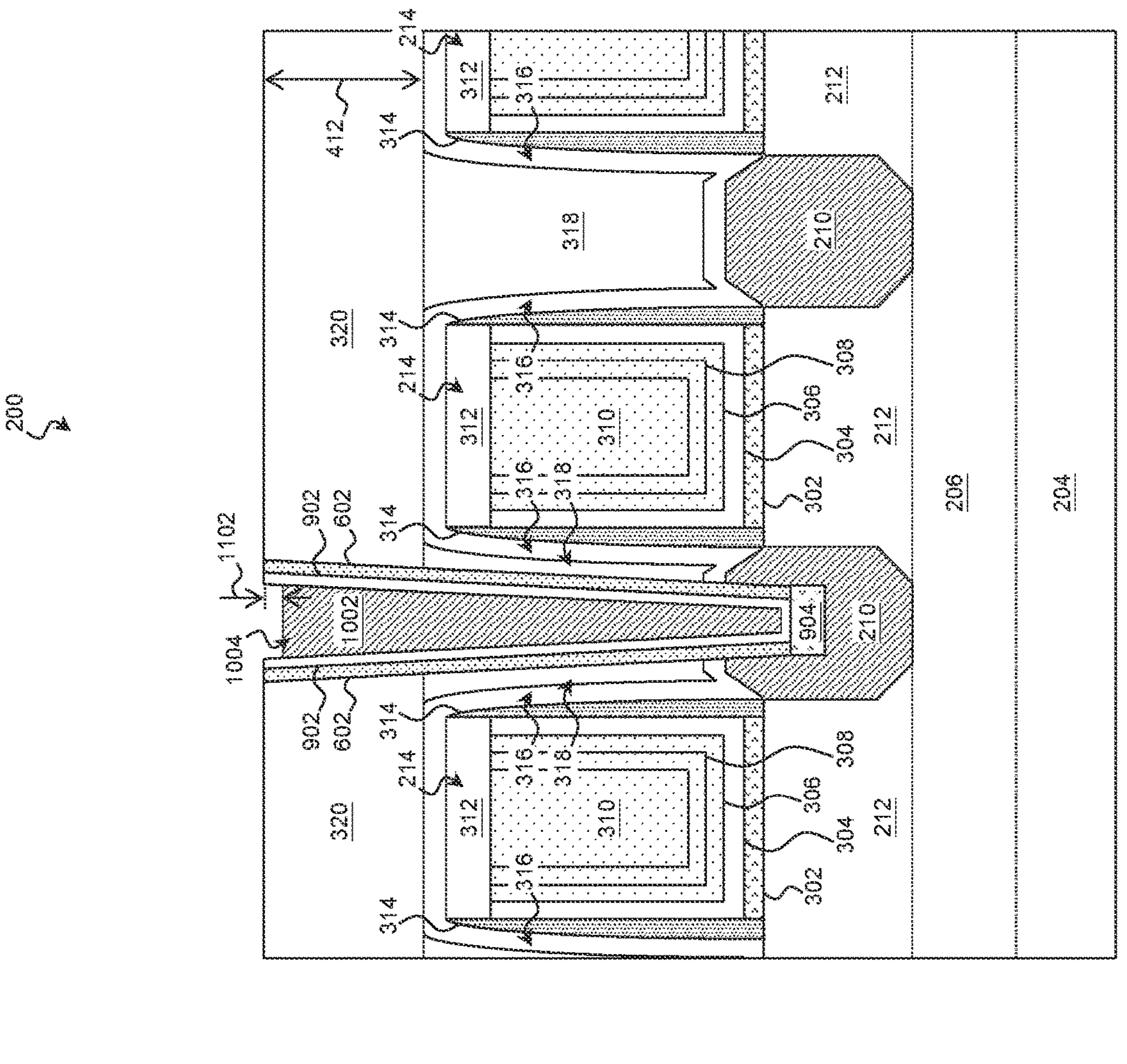

Referring to block 120 of FIG. 1A and to FIG. 11, a Chemical Mechanical Planarization/Polishing (CMP) process may be performed following the deposition of the contact fill 1002 to planarize the ILD layer 320, the dielectric contact liner 602, the contact liner 902, and the contact fill 1002. While CMP may tend to produce a substantially coplanar top surface, in many examples, some materials, such as the contact fill 1002, are recessed more than others. For example, reduced adhesion between the contact fill 1002 and the contact liner 902, grain size and grain quality of the contact fill 1002, and/or other factors may cause the contact fill 1002 to be between about 1 nm and about 2 nm shorter than the ILD layer 320, the dielectric contact liner 602, and/or the contact liner 902 as indicated by marker 1102. For reference, the thickness 412 of the ILD layer 320 above the top of the BCESL 316 may be between about 20 nm and about 30 nm at the conclusion of block 120.

Figure 12:
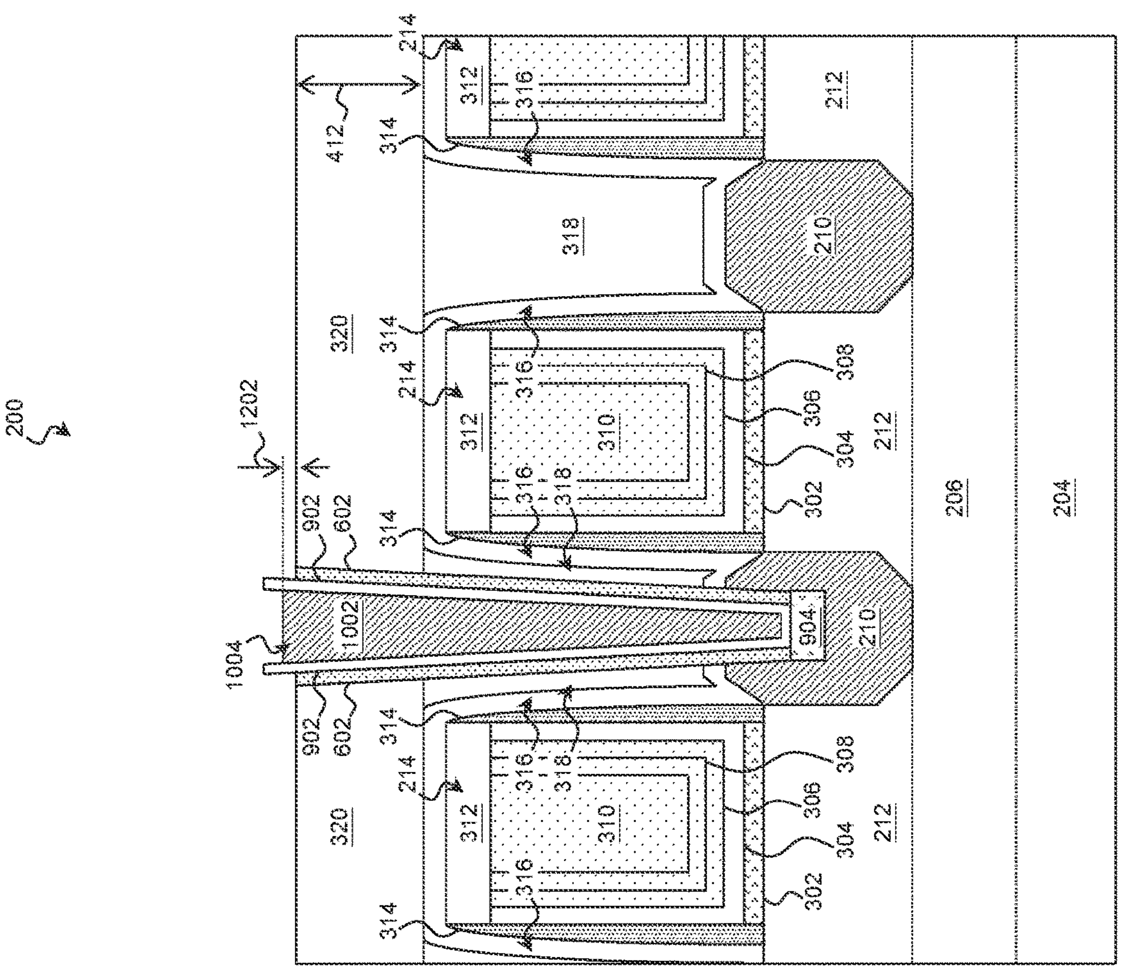

Referring to block 122 of FIG. 1B and to FIG. 12, the ILD layer 320 may be pulled back so that at least the contact fill 1002 of the contact 1004 protrudes above the top surface of the ILD layer 320. This protrusion may allow better coupling with subsequent conductive features by increasing the coupling area. However, the amount of protrusion may be limited to avoid contact-to-contact leakage. In various examples, the contact fill 1002 and optionally the contact liner 902 may protrude between about 1 nm and about 5 nm from the top of the ILD layer 320 as indicated by marker 1202.

The ILD layer 320 pull back may be performed using any suitable etching technique including dry etching, wet etching, RIE, and or other suitable etching techniques. In an example, a radical species treatment is performed that includes a dry etch using a mixture of $H_2$ and $NF_3$. The ratio of $H_2$ to $NF_3$ may be between about 25:1 and about 50:1, with some examples having a ratio greater than 40:1. The radical species treatment may be performed at a temperature between about 10° C. and about 100° C. and a pressure between about 0.3 torr and about 2.0 torr. The ILD layer 320 pull back may also pull back the dielectric contact liner 602 so that the top surfaces of the ILD layer 320 and the dielectric contact liner 602 remain substantially coplanar without significant etching of the contact fill 1002 and contact liner 902.

The etching may reduce the thickness 412 of the ILD layer 320 above the top of the BCESL 316 by between about 5 nm and about 10 nm (e.g., between about 10% and about 30%), and the thickness 412 of the ILD layer 320 may be between about 10 nm and about 20 nm at the conclusion of block 122.

Figure 13:
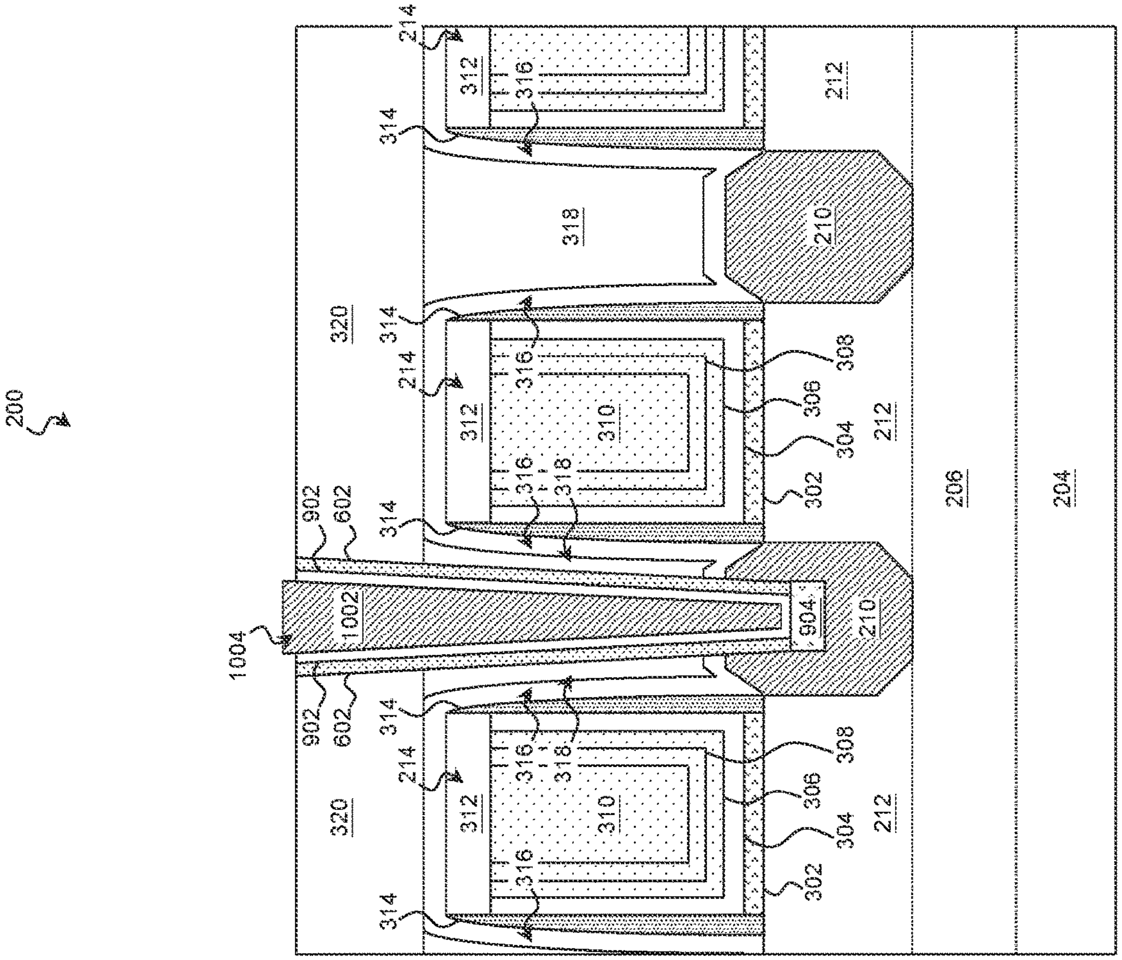

Referring to block 124 of FIG. 1B and to FIG. 13, the contact liner 902 may be pulled back to be substantially coplanar with the ILD layer 320 and/or the dielectric contact liner 602. This may be performed concurrently with block 122 or in a separate process.

The contact liner 902 pull back may be performed using any suitable etching technique, including dry etching, wet etching, RIE, and or other suitable etching techniques. In an example, wet etching is performed using Ammonia Peroxide Mixture (APM) ($NH_4OH$, $H_2O_2$, and/or de-ionized water). A suitable ratio of $NH_4OH$ to $H_2O_2$ to de-ionized water is about 1:2:40, although other suitable ratios may be used. The wet etching may be performed at a temperature between about 30° C. and about 50° C.

As explained above, because the top of the contact 1004 protrudes above ILD layer 320, some of the side surfaces of the contact fill 1002 are exposed for coupling, which may improve the interface between contacts when some degree of overlay error is present. This may allow the formation of smaller contacts. In some examples, the width of the top surface of the contact fill 1002 is between about 10 nm and about 20 nm, and the additional exposed side surfaces allow reliable connection to such minute contacts 1004.

Figure 14:
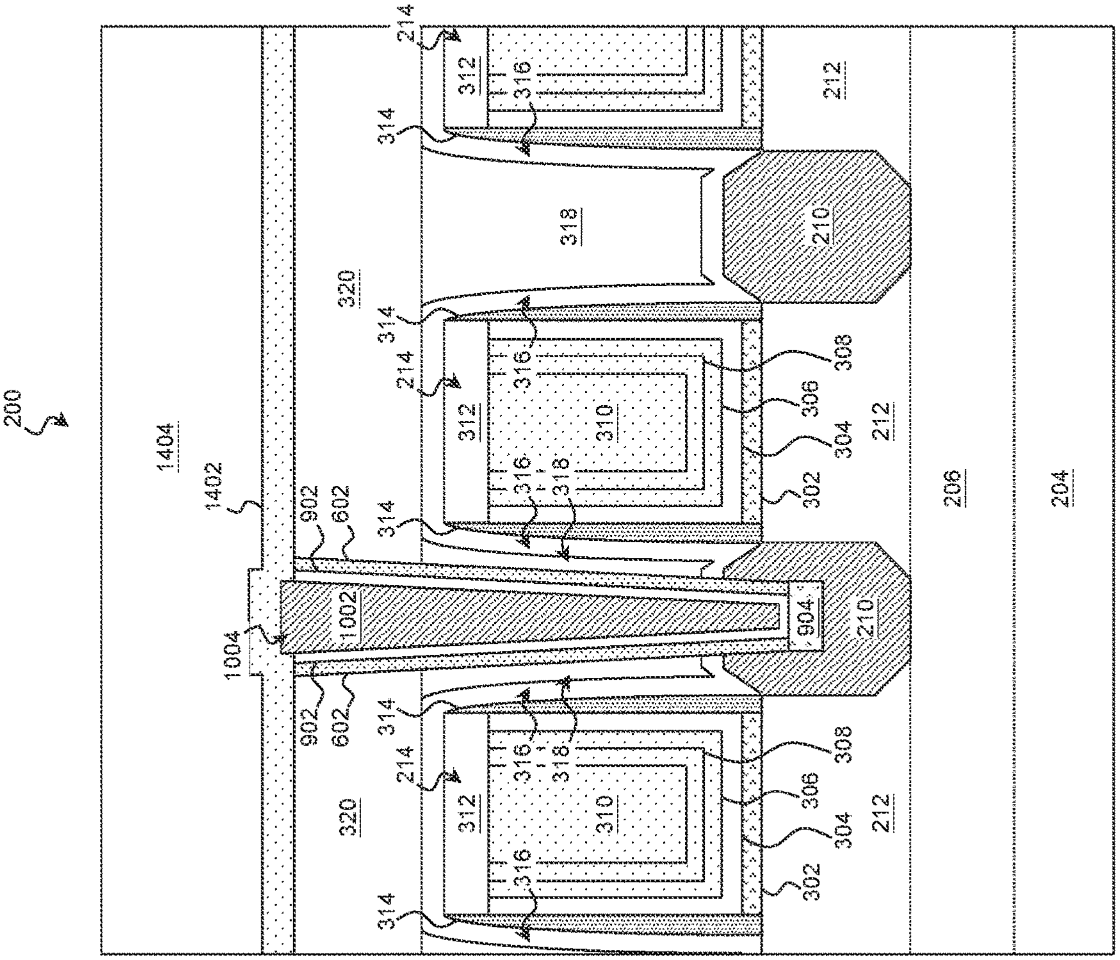

Referring to block 126 of FIG. 1B and to FIG. 14, a Middle Contact Etch-Stop Layer (MCESL) 1402 is formed on the ILD layer 320 and on the contact fill 1002. In particular, the contact fill 1002 may protrude into the MCESL 1402 and cause a mesa to form in the MCESL 1402 above the contact fill 1002. In various examples, the contact fill 1002 extends between about 1 nm and about 5 nm into the MCESL 1402.

The MCESL 1402 may include a dielectric (e.g., a semiconductor oxide, a semiconductor nitride, a semiconductor oxynitride, a semiconductor carbide, etc.) and/or other suitable material, and in various embodiments, the MCESL 1402 includes SiN, SiO, SiON, and/or SiC.

The MCESL 1402 may be deposited using ALD, PEALD, CVD, PECVD, HDP-CVD, and/or other suitable deposition processes. The MCESL 1402 may be formed to any suitable thickness, and in various such examples, the MCESL 1402 is formed using CVD to a thickness between about 1 nm and about 20 nm with the mesa protruding between about 1 nm and about 5 nm above the remainder of the MCESL 1402.

Referring to block 128 of FIG. 1B and referring still to FIG. 14, a third ILD layer 1404 is formed on the MCESL 1402. The third ILD layer 1404 may include a dielectric material (e.g., a semiconductor oxide, a semiconductor nitride, a semiconductor oxynitride, a semiconductor carbide, etc.), SOG, FSG, PSG, BPSG, Black Diamond®, Xerogel, Aerogel, amorphous fluorinated carbon, parylene, BCB, SiLK®, and/or combinations thereof The third ILD layer 1404 may be deposited using ALD, PEALD, CVD, PECVD, HDP-CVD, PVD, spin-on deposition, and/or other suitable deposition processes. The third ILD layer 1404 may be formed to any suitable thickness, and in various examples, the third ILD layer 1404 is between about 50 nm and about 100 nm thick.

Figure 15:
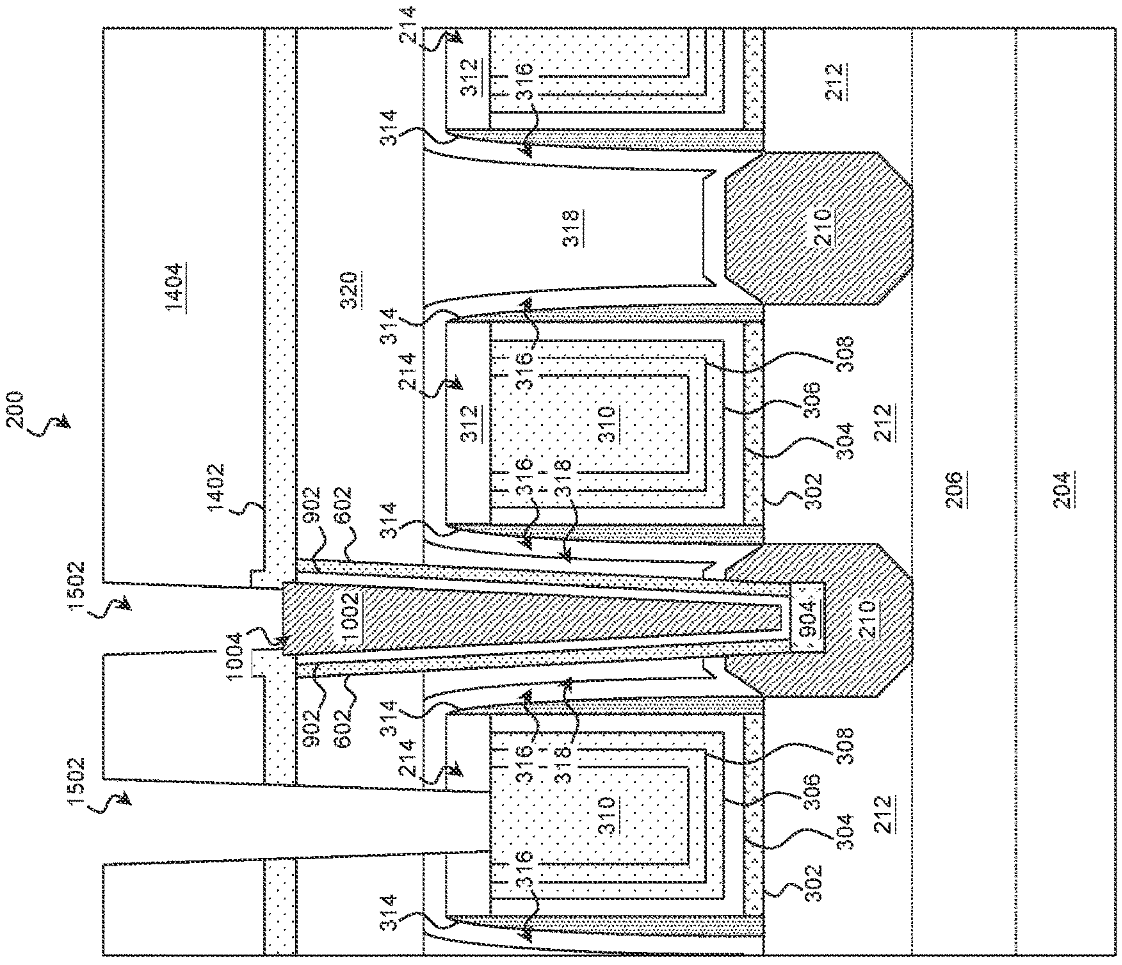

Referring to block 130 of FIG. 1B and to FIG. 15, the ILD layers 320 and 1404 are etched to form recesses 1502 for contacts that couple to the gate and contacts that couple to the existing source/drain contacts. This may be performed substantially as described in block 104, and may include one or more iterations of: forming a photoresist on the workpiece 200, patterning the photoresist 404, and etching the exposed portions of the ILD layers 320 and 1404, the MCESL 1402, the BCESL 316, and/or the gate cap 312.

Any remaining photoresist may be removed after etching the recesses 1502.

Figure 16:
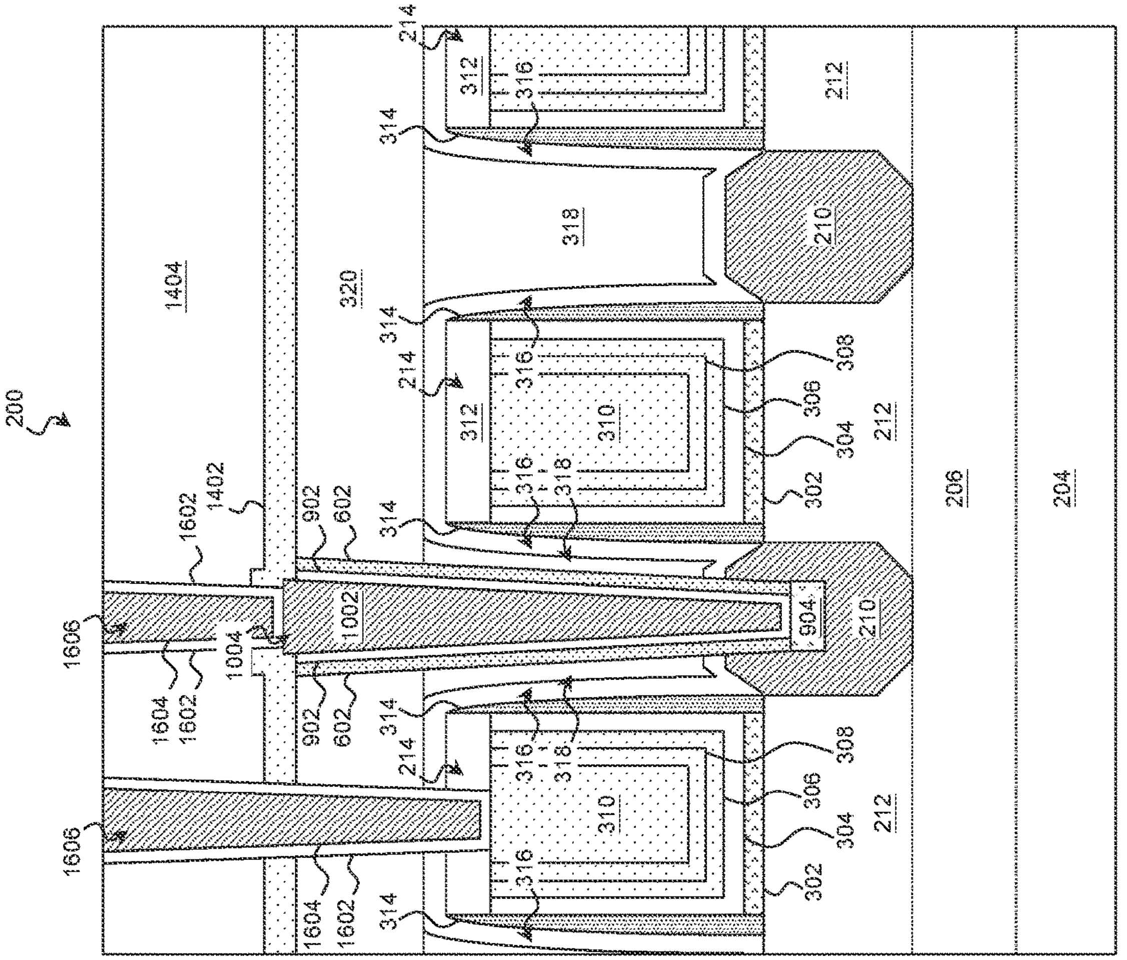

Referring to block 132 of FIG. 1B and to FIG. 16, a contact liner 1602 is formed on the side and bottom surfaces of the recesses 1502. This may be performed substantially as described in blocks 114 and/or 116 and the contact liner 1602 may be similar in composition to the contact liner 902. In that regard, the contact liner 1602 may include metals (e.g., Ti, Ta, Co, W, Al, Ni, Cu, Co, etc.), metal nitrides, metal silicon nitrides, and/or other suitable materials. In various embodiments, the contact liner 1602 includes Ti and/or TiN.

Referring to block 134 of FIG. 1B and referring still to FIG. 16, a contact fill 1604 is formed on the contact liner 1602 in the recesses 1502 to define contacts 1606 that include the contact liner 1602 and the contact fill 1604. This may be performed substantially as described in block 118 and the contact fill 1604 may be similar in composition to the contact fill 1002. In that regard, the contact fill 1604 may include metals (e.g., W, Co, Al, Ta, Ti, Ni, Cu, etc.), metal oxides, metal nitrides and/or combinations thereof, and in an example, the contact fill 1604 includes tungsten.

Figure 17:
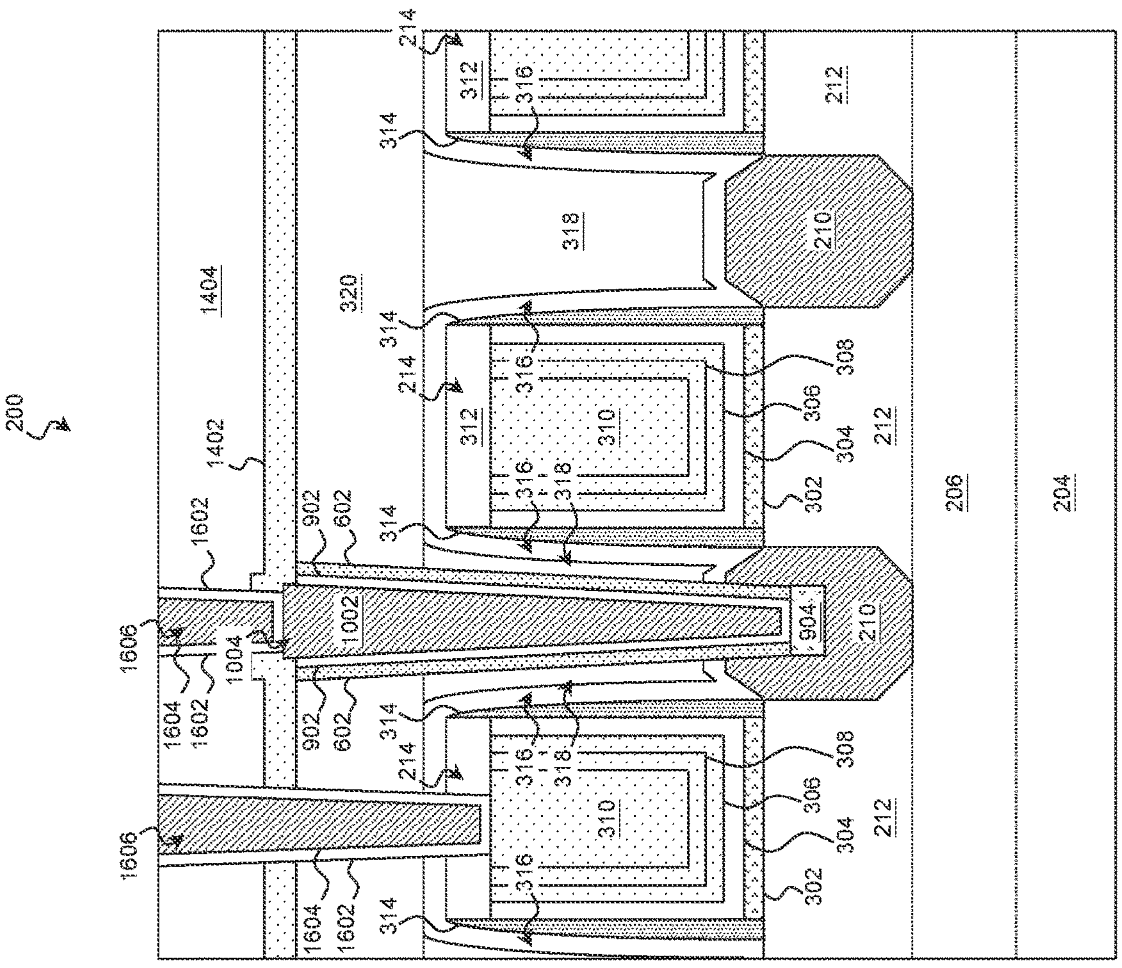

Referring to block 136 of FIG. 1B and to FIG. 17, a Chemical Mechanical Planarization/Polishing (CMP) process may be performed following the deposition of the contact fill 1604 to planarize the third ILD layer 1404, the contact liner 1602, and the contact fill 1604.

Referring to block 138 of FIG. 1B, the workpiece 200 may be provided for further fabrication. In various examples, this includes forming a remainder of an electrical interconnect structure, dicing, packaging, and other fabrication processes.

Figure 18:
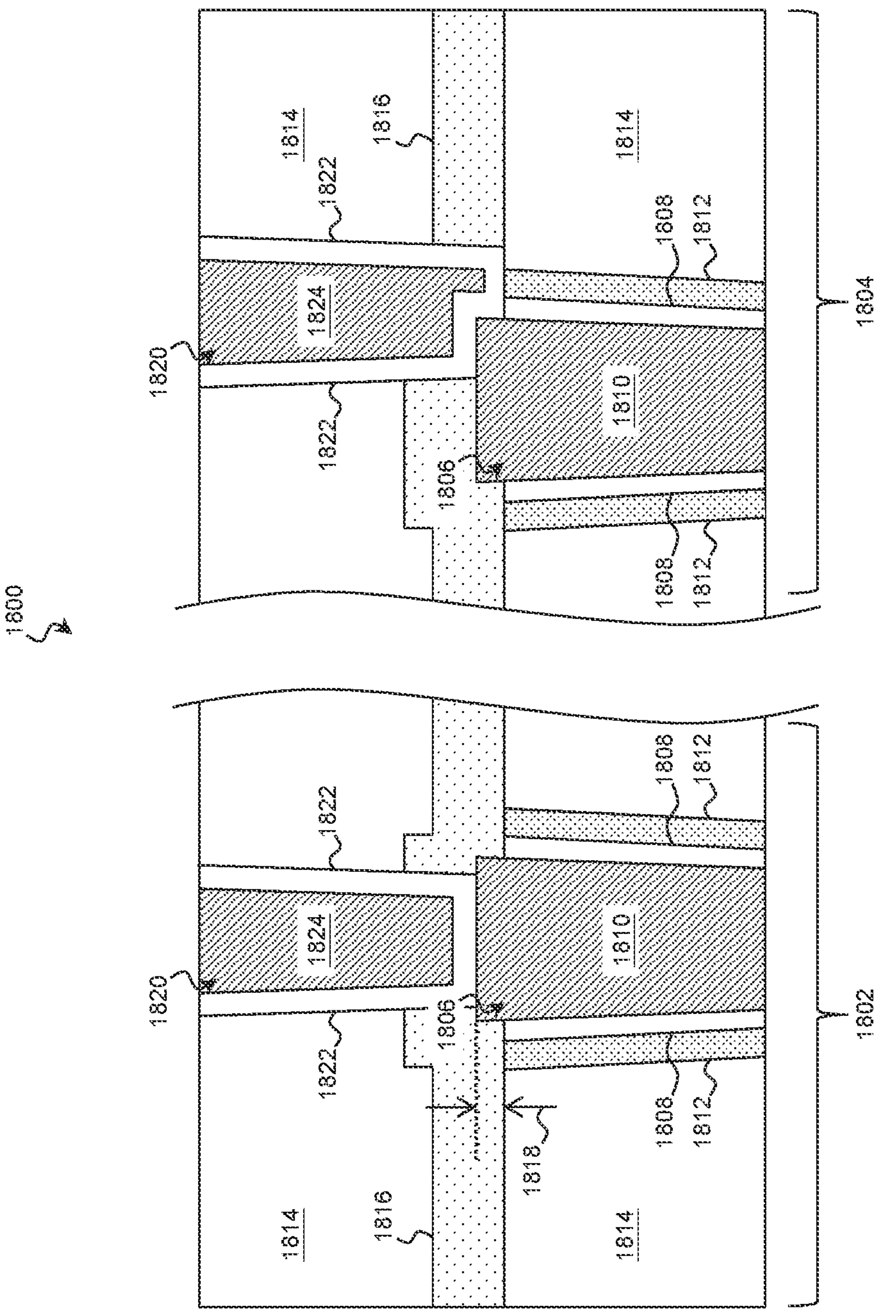
FIG. 18 is a cross-sectional illustration of a workpiece having a degree of overlay error taken in a fin-length direction that cuts through a fin according to various aspects of the present disclosure.

The above examples illustrate the workpiece 200 with an ideal overlay arrangement between contacts 1004 and contacts 1606 so that the entirety of the bottom surface of contact 1606 is in direct physical contact with the topmost surface of contact 1004. Further examples showing conductive interconnect features with some degree of overlay misalignment are illustrated with respect to FIG. 18. FIG. 18 is a cross-sectional illustration of a workpiece 1800 taken in a fin-length direction that cuts through a fin according to various aspects of the present disclosure.

Workpiece 1800 is substantially similar to workpiece 200 above, except as noted, and may be formed by method 100. In fact, in some examples, the workpiece 1800 is workpiece 200. The workpiece 1800 includes two regions. The first region 1802 and the second region 1804 each include a first interconnect feature 1806, such as the source/drain contact 1004 above. In further examples, the first interconnect feature 1806 is a via or other conductive interconnect feature. The first interconnect feature 1806 includes a liner 1808 and a fill 1810, substantially similar the contact liner 902 and contact fill 1002 above. The first interconnect feature 1806 may also include a dielectric liner 1812 substantially similar to the dielectric contact liner 602 above.

The first interconnect feature 1806 may be formed by method 100 and accordingly, the fill 1810 extends above the top surface of an ILD layer 1814 and into a MCESL 1816. In various such examples, the fill 1810 of the first interconnect feature 1806 extends between about 1 nm and about 5 nm above the top surface of the ILD layer 1814 as indicated by marker 1818.

The first region 1802 and the second region 1804 each further include a second interconnect feature 1820 that extends through another ILD layer 1814 and the MCESL 1816 to couple to the first interconnect feature 1806. The second interconnect feature 1820 includes a liner 1822 and a fill 1824, substantially similar to the contact liner 1602 and contact fill 1604 above.

In the first region 1802, the overlay arrangement of interconnect features 1806 and 1820 is such that the entirety of the bottom surface of interconnect feature 1820 is in direct physical contact with the topmost surface of interconnect feature 1806. However, the second region 1804 illustrates some degree of overlay misalignment between the features. Accordingly, a portion of interconnect feature 1820 physically contacts the topmost surface of interconnect feature 1806, while the remainder extends past the lower interconnect feature 1806. However, because the remaining portion of interconnect feature 1820 physically contacts a side surface of the lower interconnect feature 1806, a reliable electrical connection is still made.

Thus, the present disclosure provides examples of an integrated circuit with an interconnect structure and a method for forming the integrated circuit. In some embodiments, a method of forming an integrated circuit device includes receiving a workpiece that includes an inter-level dielectric layer. A first contact that includes a fill material is formed that extends through the inter-level dielectric layer. The inter-level dielectric layer is recessed such that the fill material extends above a top surface of the inter-level dielectric layer. An etch-stop layer is formed on the inter-level dielectric layer such that the fill material of the first contact extends into the etch-stop layer. A second contact is formed extending through the etch-stop layer to couple to the first contact. In some such embodiments, the second contact physically contacts a top surface and a side surface of the first contact. In some such embodiments, the first contact further includes a liner and the fill material is disposed within the liner. The liner is recessed such that the fill material extends above a top surface of the liner. In some such embodiments, the workpiece includes a source/drain feature, and the forming of the first contact includes depositing a liner precursor within a recess in the inter-level dielectric layer and annealing the workpiece to form a liner and to form a silicide feature between the source/drain feature and the liner. In some such embodiments, the inter-level dielectric layer extends above a top surface of the fill material prior to the recessing of the inter-level dielectric layer. In some such embodiments, the workpiece includes a source/drain feature, and the forming of the first contact includes forming a recess in the inter-level dielectric layer and in the source/drain feature. In some such embodiments, the recess has a depth such that the fill material extends below a top surface of the source/drain feature. In some such embodiments, the forming of the first contact further includes forming a dielectric liner on side surfaces of the recess. In some such embodiments, the dielectric liner extends into the source/drain feature.

In further examples, a method includes receiving a workpiece that includes a source/drain feature and an inter-level dielectric layer disposed on the source/drain feature. A first contact is formed extending through the inter-level dielectric layer to electrically couple to the source/drain feature, and the inter-level dielectric layer is recessed such a top surface of the first contact is above a top surface of the inter-level dielectric layer. A second contact is formed that is coupled to the first contact. In some such embodiments, the second contact physically contacts a top surface and a side surface of the first contact. In some such embodiments, an etch-stop layer is formed on the inter-level dielectric layer and on the first contact. The first contact extends into the etch-stop layer, and the second contact extends through the etch-stop layer to couple to the first contact. In some such embodiments, the etch-stop layer includes a mesa disposed over the first contact that extends above a remainder of the etch-stop layer. In some such embodiments, the first contact extends below a top surface of the source/drain feature. In some such embodiments, the forming of the first contact includes: depositing a liner precursor on the inter-level dielectric layer and on the source/drain feature and annealing the workpiece to form a liner and to form a silicide feature between the source/drain feature and the first contact. In some such embodiments, the inter-level dielectric layer extends above a top surface of the first contact prior to the recessing of the inter-level dielectric layer.

In yet further embodiments, an integrated circuit device includes a substrate, a dielectric layer disposed on the substrate, a first contact extending through the dielectric layer that extends above the dielectric layer, and a second contact that physically contacts a top surface of the first contact. In some such embodiments, the second contact further physically contacts a side surface of the first contact. In some such embodiments, the second contact extends beyond the first contact to physically contact the dielectric layer. In some such embodiments, the first contact includes a liner and a contact fill disposed within the liner, and the contact fill extends above a topmost surface of the liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising
- a fin structure disposed on a substrate;
- a gate structure disposed on the fin structure;
- a source/drain feature associated with the gate structure;
- a first dielectric layer disposed on the gate structure, the first dielectric layer having a top surface extending to a first height above the substrate, the top surface of the first dielectric layer facing away from the substrate;
- a first contact feature extending through the first dielectric layer to electrically couple to the source/drain feature, the first contact feature extending to a second height above the substrate, the second height being greater than the first height;
- a first contact liner interfacing with the first contact feature and extending from the source/drain feature to the first height above the substrate; and
- a first etch stop layer interfacing with the top surface of the first dielectric layer, the first contact feature and the first contact liner.

2. The device of claim 1, wherein the source/drain feature includes a silicide layer and the first contact feature interfaces with the silicide layer.

3. The device of claim 2, wherein the first contact liner interfaces with the silicide layer.

4. The device of claim 1, wherein the first contact feature includes:
- a conductive fill material; and
- a second contact liner disposed on the conductive fill material.

5. The device of claim 4, wherein the second contact liner is formed of a different material than the first contact liner.

6. The device of claim 5, wherein the first and second contact liners both include a nitrogen containing material.

7. The device of claim 1,
- wherein the first contact feature includes a first sidewall surface and an opposing second sidewall surface and a top surface extending from the first sidewall surface to the second sidewall surface, and
- wherein the first etch stop layer interfaces with the first sidewall surface and the top surface of the first contact feature.

8. The device of claim 1, further comprising:
- a second dielectric layer disposed on and interfacing with the first etch stop layer; and
- a second contact feature extending through the second dielectric layer to the first contact feature, wherein the second contact feature interfaces with the first contact feature, the second dielectric layer and the first etch stop layer.

9. A device comprising
- a gate structure disposed on a substrate;
- a source/drain feature associated with the gate structure;
- a first dielectric layer disposed on the gate structure;
- a first contact feature extending through the first dielectric layer to the source/drain feature;
- a first liner layer extending along a sidewall surface of the first contact feature to the source/drain feature; and
- a second contact feature interfacing with a top surface and the sidewall surface of the first contact feature, the top surface of the first contact feature facing away from the substrate.

10. The device of claim 9, further comprising a fin structure disposed on the substrate, wherein the source/drain feature is at least partially embedded within the fin structure.

11. The device of claim 9, wherein the first contact feature includes:
- a conductive material layer; and
- a second liner layer.

12. The device of claim 11,
- wherein the first liner layer and the second liner layer extend to a first height above the substrate, and
- wherein the conductive material layer extends to a second height above the substrate that is greater than the first height.

13. The device of claim 11, wherein the sidewall surface of the first contact feature includes a first portion defined by the second liner layer and a second portion defined by the conductive material layer.

14. The device of claim 13, further comprising a first etch stop layer disposed directly on the first dielectric layer, and wherein the first dielectric layer interfaces with the first portion of the sidewall surface of the first contact feature and the first etch stop layer interfaces with the second portion of the sidewall surface of the first contact feature.

15. The device of claim 14, wherein the first etch stop layer interface with the first liner layer and the second liner layer.

16. A device comprising:

a source/drain feature disposed on a substrate;

a first dielectric layer disposed on the source/drain feature, the first dielectric layer extending to a first height above the substrate;

a first etch stop layer disposed directly on the first dielectric layer; and a first contact extending through the first dielectric layer to the source/drain feature, wherein the first contact includes:

a conductive fill extending to a second height above the substrate that is greater than the first height, wherein the conductive fill includes opposing sidewall surfaces and the first etch stop layer interfaces with at least one of surfaces of the conductive fill; and a first liner layer disposed on the conductive fill, the first liner layer extending to the first height above the substrate.

17. The device of claim 16, wherein the first liner layer extends continuously from the first etch stop layer to the source/drain feature.

18. The device of claim 17, wherein at least a portion of the conductive fill and the first liner layer are disposed within the source/drain feature.

19. The device of claim 16, further comprising:

a gate structure disposed on the substrate, the gate structure associated with the source/drain feature; and a second etch stop layer extending from the gate structure to the source/drain feature.

20. The device of claim 19, further comprising a second liner layer disposed along and interfacing with the first liner layer, and wherein the second etch stop layer interfaces with the second liner layer.

* * * * *